United States Patent
Ohkawa

(10) Patent No.: US 8,405,795 B2
(45) Date of Patent: Mar. 26, 2013

(54) LIGHT EMITTING DEVICE ASSEMBLY, SURFACE LIGHT SOURCE DEVICE, LIQUID CRYSTAL DISPLAY DEVICE ASSEMBLY, AND LIGHT OUTPUT MEMBER

(75) Inventor: Shingo Ohkawa, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/591,377

(22) Filed: Aug. 22, 2012

(65) Prior Publication Data

US 2012/0314424 A1  Dec. 13, 2012

Related U.S. Application Data

(62) Division of application No. 12/506,319, filed on Jul. 21, 2009, now Pat. No. 8,269,916.

(30) Foreign Application Priority Data

Jul. 24, 2008  (JP) ............................. P2008-191162

(51) Int. Cl.
  *G02F 1/1335* (2006.01)
(52) U.S. Cl. .............. 349/64; 349/61; 257/88; 362/335; 362/311.06; 362/336; 362/612; 313/501; 313/512
(58) Field of Classification Search .................. 349/61, 349/64; 362/335, 311, 336; 257/88; 313/501, 313/512
See application file for complete search history.

(56) References Cited

U.S. PATENT DOCUMENTS

| 4,609,978 | A | 9/1986 | Hsieh et al. |
| 7,348,723 | B2 | 3/2008 | Yamaguchi et al. |
| 2006/0186431 | A1 | 8/2006 | Miki et al. |
| 2007/0159832 | A1 | 7/2007 | Kim et al. |
| 2008/0164482 | A1* | 7/2008 | Obara et al. ..................... 257/88 |
| 2010/0123855 | A1* | 5/2010 | Shin ................................ 349/61 |
| 2012/0057101 | A1* | 3/2012 | Iiyama et al. ................... 349/64 |
| 2012/0120343 | A1* | 5/2012 | Yamamoto ...................... 349/61 |

FOREIGN PATENT DOCUMENTS

| JP | 2001-022285 | 1/2001 |
| JP | 2004-127643 | 4/2004 |
| JP | 2004-133391 | 4/2004 |
| JP | 2006-092983 | 4/2006 |
| JP | 2006-113556 | 4/2006 |
| JP | 2007-096318 | 4/2007 |
| JP | 2007-140524 | 6/2007 |
| JP | 2007 188858 | 7/2007 |
| JP | 2007-188858 | 7/2007 |
| JP | 2008-123847 | 5/2008 |
| JP | 2010-524175 | 7/2010 |

OTHER PUBLICATIONS

Japanese Office Action for Japanese Patent Application No. 2008-191162, dated Oct. 2, 2012 (3 pages).

* cited by examiner

*Primary Examiner* — Huyen Ngo
(74) *Attorney, Agent, or Firm* — Finnegan, Henderson, Farabow, Garrett & Dunner LLP

(57) ABSTRACT

A light emitting device assembly includes: a light emitting device; and a light output member provided on the light emitting element and having an upper surface on which a curved part that outputs light from the light emitting device is provided, wherein a value of a x coordinate of a curved part center axis is a positive value, a locus of an edge of a curved part forms a circle or oval around the curved part center axis, light on a Z-axis output from an origin is output from the curved part at an angle $\theta_0$ ($\theta_0>0$) formed with the Z-axis within a XZ-plane, and function $F(\phi,\Delta\phi)$ expressed by $$F(\phi,\Delta\phi)=(\Delta\theta_+ - \Delta\theta_-) \quad (1)$$

monotonously increases, takes the maximum value at $\phi=\phi_0$ (<0), and then, monotonously decreases as a value of $\phi$ increases from the minimum value.

13 Claims, 23 Drawing Sheets

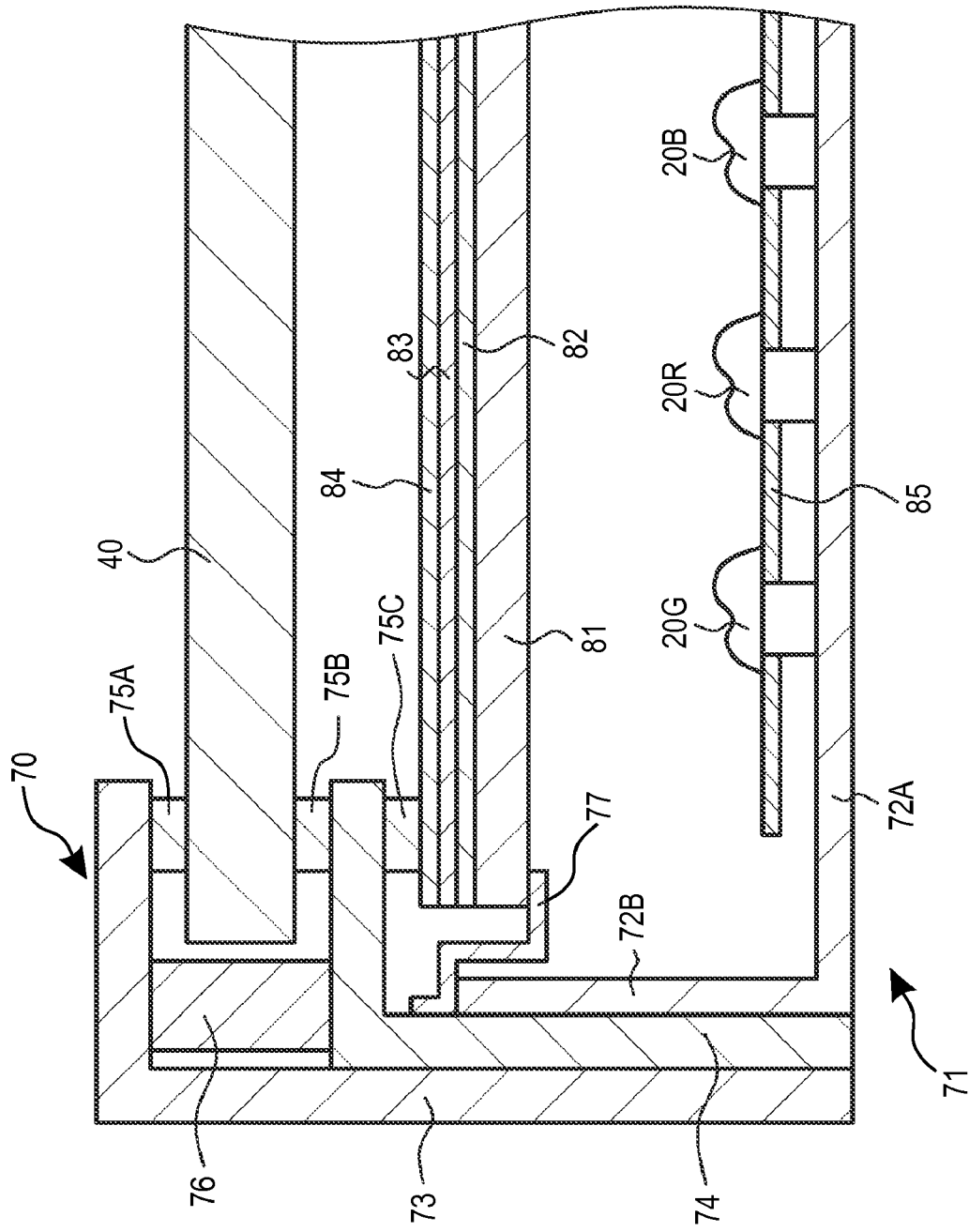

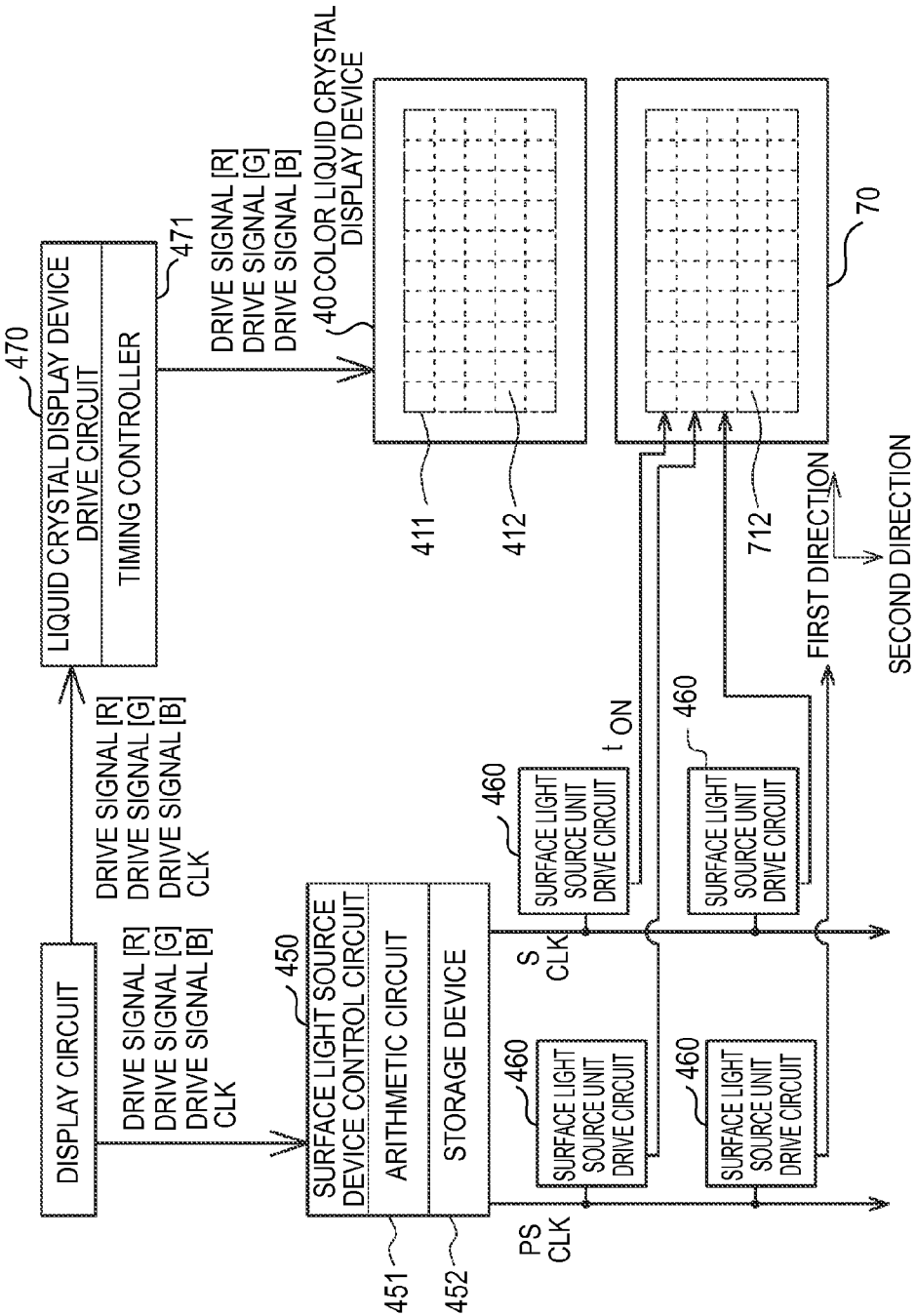

VALUE OBTAINED BY RAISING DRIVE SIGNAL TO POWER OF 2.2
($SX' \equiv SX^{2.2}$)

VALUE OF CONTROL SIGNAL (SX)

LIGHT EMITTING DEVICE ASSEMBLY, SURFACE LIGHT SOURCE DEVICE, LIQUID CRYSTAL DISPLAY DEVICE ASSEMBLY, AND LIGHT OUTPUT MEMBER

This application is a divisional of application Ser. No. 12/506,319, filed on Jul. 21, 2009, now U.S. Pat. No. 8,269,916, which claims the benefit of priority from prior Japanese Patent Application No. JP 2008-191162, filed in Japan Patent Office on Jul. 24, 2008, the entire contents of which are incorporated herein by reference.

BACKGROUND OF THE INVENTION

1. Field of the Invention

The present invention relates to a light output member, a light emitting device assembly including the light output member, a surface light source device including the light emitting device assembly, and a liquid crystal display device assembly including the surface light source device.

2. Background Art

As a liquid crystal display device assembly, a liquid crystal display device assembly including a liquid crystal device in which a liquid crystal material is sandwiched between two panels opposed by superimposing transparent glass substrates with transparent electrodes, alignment films, etc. stacked thereon, and a surface light source device provided under the liquid crystal display device (in the Z-axis direction) for supplying illumination light to the liquid crystal display device is known. Further, as the surface light source device, a direct-type surface light source device is known.

As shown in a conceptual diagram of FIG. 25A, a direct-type surface light source device 870 includes a light source 820 provided within a casing 871, a reflector member 885 that reflects output light from the light source 820 upward, and a light diffuser plate 881 that is disposed to an opening of the casing located above the light source 820 and diffuses the output light from the light source 820 and the reflected light from the reflector member 885 through itself. Further, the light source 820 includes plural red light emitting diodes, plural green light emitting diodes and plural blue light emitting diodes, and white light with high color purity obtained by mixing red, green and blue light output from these light emitting diodes is used as illumination light.

In a configuration in which light output from light emitting diodes is entered directly into the liquid crystal display device located above, that is, when light is output from the light emitting diodes mainly in the Z-axis direction, luminance irregularities and color irregularities occur in the surface light source device. Accordingly, a two-dimensional-direction output configuration using a light emitting diode assembly including a luminous flux control member having a recessed part on the upper surface and light emitting diodes as a light source for outputting the light output from the light emitting diodes from the luminous flux control member in a horizontal direction is known from JP-A-2006-092983, for example. Further, a structure using a light emitting diode assembly including a lens having a characteristic shape and light emitting diodes as a light source for outputting the light output from the light emitting diodes from the lens in a predetermined direction is known from JP-A-2007-188858, for example.

SUMMARY OF THE INVENTION

In a technology disclosed in JP-A-2006-092983, as shown in FIG. 25B, the axis line passing through the center of the light emitting diode in parallel with the normal line of the light exit surface of the light emitting diode and the axis line passing through the luminous flux control member are aligned. Further, the luminous flux control member has a shape rotationally symmetric with respect to the axis line. Thus, even using the light emitting diode assembly including red light emitting diodes, the light emitting diode assembly including green light emitting diodes, and the light emitting diode assembly including blue light emitting diodes, and mixing red, green and blue output from these light emitting diodes, there are problems that color irregularities are not sufficiently resolved and luminance irregularities are not sufficiently resolved.

In a technology disclosed in JP-A-2007-188858, nothing about the specific shape of the lens is mentioned.

Accordingly, it is desirable to provide a light emitting device assembly having a configuration and structure in which luminance irregularities and color irregularities are hard to occur, a light output member (light extraction lens) suitable for use in the light emitting device assembly, a surface light source device including the light emitting device assembly, and a liquid crystal display device assembly including the surface light source device.

A light output member according to an embodiment of the invention is provided on the light emitting element and having an upper surface on which a curved part that outputs light from the light emitting device is provided.

A light emitting device assembly according to an embodiment of the invention includes:

(A) a light emitting device; and (B) a light output member provided on the light emitting element and having an upper surface on which a curved part that outputs light from the light emitting device is provided.

Further, assuming that (i) an axis line passing through the center of the curved part and being in parallel with a normal line of a light exit surface of the light emitting device is a curved part center axis, (ii) an orthogonal coordinate system (x, y, z) in a three-dimensional space has the normal line of the light exit surface of the light emitting device passing through the center of the light emitting device as the Z-axis, a plane containing the curved part center axis and the Z-axis as the XZ-plane, a point at which the Z-axis and the light exit surface of the light emitting device intersects as the origin O, (iii) when light output from the curved part travels in a positive direction of the X-axis within the XZ-plane, an angle formed by the traveling direction of the light and the Z-axis takes a positive value, (iv) the light output from the origin O at an angle $\phi$ formed with the Z-axis within the XZ-plane is output from the curved part at an angle $\theta$ formed with the Z-axis within the XZ-plane, (v) the light output from the origin O at an angle $(\phi+|\Delta\phi|/2)$ formed with the Z-axis within the XZ-plane is output from the curved part at an angle $(\theta+\Delta\theta_+)$ formed with the Z-axis within the XZ-plane, and (vi) the light output from the origin O at an angle $(\phi-|\Delta\phi|/2)$ formed with the Z-axis within the XZ-plane is output from the curved part at an angle $(\theta+\Delta\theta_+)$ formed with the Z-axis within the XZ-plane, the value of the x coordinate $(X_{CL})$ of the curved part center axis is a positive value, a locus of an edge of the curved part forms a circle or oval around the curved part center axis, the light on the Z-axis output from the origin O is output from the curved part at an angle $\theta_0$ ($\theta_0 > 0$) formed with the Z-axis within the XZ-plane, and function $F(\phi, \Delta\phi)$ expressed by $$F(\phi, \Delta\phi) = (\Delta\theta_+ - \Delta\theta_-)/\Delta\phi \qquad (1)$$

monotonously increases, takes the maximum value at $\phi = \phi_0$ (<0), and then, monotonously decreases as the value of $\phi$ increases from the minimum value.

A surface light source device according to a first embodiment of the invention includes plural light emitting device assembly units, each light emitting device assembly unit includes plural light emitting device assemblies, and each light emitting device assembly includes the above described light emitting device assembly of the embodiment of the invention. Further, in each light emitting device assembly unit, X-axes toward the positive directions of the respective plural light emitting device assemblies intersect at one point. Note that, strictly, they may not intersect at one point depending on variations in assembling. The same is true in the following cases.

Further, a liquid crystal display device assembly according to the first embodiment of the invention includes:

(a) a liquid crystal display device; and (b) a surface light source device that illuminates the liquid crystal display device from a rear side (more specifically, a direct-type surface light source device), and the surface light source device includes plural light emitting device assembly units, each light emitting device assembly unit includes plural light emitting device assemblies, and each light emitting device assembly includes the above described light emitting device assembly of the embodiment of the invention. Further, in each light emitting device assembly unit, X-axes toward the positive directions of the respective plural light emitting device assemblies intersect at one point.

In the surface light source device according to the first embodiment of the invention or the surface light source device in the liquid crystal display device assembly according to the first embodiment of the invention (hereinafter, these may be collectively referred to as "the surface light source device and the like according to the first embodiment of the invention", a light diffuser plate may be provided above the light emitting device assembly units.

Further, in the surface light source device and the like according to the first embodi8ment of the invention including the preferred embodiment, it is desirable that the light emitting device assembly unit includes three light emitting device assemblies, respective Z-axes in the three light emitting device assemblies are located on apexes of equilateral triangles and on circles with radius $R_c$, and given that a distance from the light exit surface of the light emitting device to the light diffuser plate is H, $$0.1 \leq R_c/H \leq 0.6$$

is satisfied. Note that, given that an angle formed by the light having the maximum light intensity with the Z-axis is $\theta_{I-max}$ within the XZ-plane, the $\theta_{I-max}$ is from 50 degrees to 85 degrees, preferably from 60 degrees to 80 degrees. Here, strictly, the distance from the point on the curved part at which the light having the maximum light intensity is output to the light diffuser plate should be given as "H", however, the distance H from the light exit surface of the light emitting device to the light diffuser plate is used in the above expression because the distance from the point on the curved part at which the light having the maximum light intensity is output to the light diffuser plate and the distance from the light exit surface of the light emitting device to the light diffuser plate are nearly equal. The same is applied in the following cases. The three light emitting device assemblies forming one light emitting device assembly unit may include one light emitting device assembly that emits red light, one light emitting device assembly that emits green light, and one light emitting device assembly that emits blue light.

Alternatively, in the surface light source device and the like according to the first embodiment of the invention including the preferred embodiment, it is desirable that the light emitting device assembly unit includes four light emitting device assemblies, respective Z-axes in the four light emitting device assemblies are located on the apexes of squares and on circles with radius $R_c$, and given that the distance from the light exit surface of the light emitting device to the light diffuser plate is H, $$0.1 \leq R_c/H \leq 0.6$$

is satisfied. Note that, given that an angle formed by the light having the maximum light intensity with the Z-axis is $\theta_{I-max}$ within the XZ-plane, the $\theta_{I-max}$ is from 50 degrees to 85 degrees, preferably from 60 degrees to 80 degrees. The four light emitting device assemblies forming one light emitting device assembly unit may include one light emitting device assembly that emits red light, two light emitting device assemblies that emit green light, and one light emitting device assembly that emits blue light.

A surface light source device according to a second embodiment of the invention includes plural light emitting device assembly units, each light emitting device assembly unit includes plural pair of opposed light emitting device assemblies, and each light emitting device assembly includes the above described light emitting device assembly of the embodiment of the invention. Further, in each light emitting device assembly unit, X-axes of the pair of opposed light emitting device assemblies overlap, and positive directions of the X-axes of the pair of opposed light emitting device assemblies are opposite to each other. Note that, depending on variations in assembling, the X-axes may not strictly overlap or the positive directions of the X-axes may not strictly be opposite to each other. The same is true in the following cases.

Further, a liquid crystal display device assembly according to the second embodiment of the invention includes:

(a) a liquid crystal display device; and (b) a surface light source device that illuminates the liquid crystal display device from a rear side (more specifically, a direct-type surface light source device), and the surface light source device includes plural light emitting device assembly units, each light emitting device assembly unit includes plural pair of opposed light emitting device assemblies, and each light emitting device assembly includes the above described light emitting device assembly of the embodiment of the invention. Further, in each light emitting device assembly unit, X-axes of the pair of opposed light emitting device assemblies overlap, and positive directions of the X-axes of the pair of opposed light emitting device assemblies are opposite to each other.

In the surface light source device according to the second embodiment of the invention and the surface light source device in the liquid crystal display device assembly according to the second embodiment of the invention (hereinafter, these may be collectively referred to as "the surface light source device and the like according to the second embodiment of the invention", the pair of light emitting device assemblies may include light emitting device assemblies that emit white light.

In the surface light source device and the like according to the second embodiment of the invention, it is desirable that, given that a distance between Z-axes in the pair of opposed light emitting device assemblies within one light emitting device assembly unit is $L_1$, a distance between centers of the light emitting device assembly units adjacent to each other in the X-axis direction is $L_2$, and a distance from the light exit surface of the light emitting device to the light diffuser plate is H, $$0.1 \leq (L_2/4 - L_1/2)/H \leq 0.6$$

is satisfied. Note that, given that an angle formed by the light having the maximum light intensity with the Z-axis is $\theta_{I-max}$ within the XZ-plane, the $\theta_{I-max}$ is from 50 degrees to 85 degrees, preferably from 60 degrees to 80 degrees.

Hereinafter, the light output member of the embodiment of the invention, the light output member (light extraction lens) in the light emitting device assembly of the embodiment of the invention, the light output member (light extraction lens) in the surface light source device according to the first embodiment or the second embodiment of the embodiment of the invention including various preferred embodiments and configurations, and the light output member (light extraction lens) in the liquid crystal display device assembly according to the first embodiment or the second embodiment of the embodiment of the invention may be collectively referred to as "the light output member of the embodiment of the invention and the like".

In the light output member and the like of the embodiment of the invention, the curved part may have a concave surface and a convex surface continuous from the concave surface, an angle $\phi_{min-v}$ formed by a local minimum point of the concave surface and the origin may satisfy $\phi_{min-v} < \phi_0$, a curve obtained when the curved part is cut along an arbitrary virtual plane containing the normal line of the light exit surface of the light emitting device and passing through the local minimum point of the concave surface, from the local maximum point as the starting point, may monotonously increase from a convex downward condition via a point of inflexion into a convex upward condition, pass through the local maximum point, and monotonously decrease in a convex upward condition.

In the light output member and the like of the embodiment of the invention including the above preferred configuration, $\Delta\phi$ may take one value equal to or less than 60 degrees, for example, one value from 1 degree to 60 degrees, preferably from 1 degree to 20 degrees.

In the light output member and the like of the embodiment of the invention including the above preferred configuration, a value $x_{I-max}$ of x coordinate at a point where light having the maximum light intensity may be output from the curved part within the XZ-plane is a positive value.

Alternatively, in the light output member and the like of the embodiment of the invention including the above preferred configuration, it is preferable that a curve obtained when the curved part is cut along the XZ-plane includes a first curve having a first local maximum value in a convex upward condition, a second curve smoothly connected (i.e., via a point of inflexion) to the first curve and having a local minimum value in a convex downward condition, and a third curve smoothly connected (i.e., via a point of inflexion) to the second curve and having a second local maximum value in a convex upward condition, as the value of the x coordinate increases from the minimum value. Further, in this case; it is desirable that the second maximum value is larger than the first maximum value. The first curve, the second curve, the third curve may be smooth curves, and the function forms are not ambiguously determined. Each of the first curve, the second curve, the third curve may be expressed by a combination of second or higher order polynomials (i.e., the micro areas are expressed by second or higher order polynomials and the second or higher order polynomials are smoothly connected to form the curves), or a combination of functions approximated by second or higher order polynomials (i.e., the micro areas are expressed by functions approximated by second or higher order polynomials and the functions approximated by second or higher order polynomials are smoothly connected to form the curves).

In the above described light output member and the like of the embodiment of the invention including the preferred configuration and form, it is desirable that the curved part has a non-rotationally symmetric shape with respect to the Z-axis. Further, in the above described light output member and the like of the embodiment of the invention including the preferred configuration and form, it is preferable that the curved part is symmetric with respect to the XZ-plane.

Furthermore, in the above described light output member and the like of the embodiment of the invention including the preferred configuration and form, the light emitting device may face the light output member via a light transmissive medium layer, or, using the light output member as a sealing member, the light emitting device may be covered by the light output member without gaps. By employing these forms, undesired gaps are not formed between the light emitting device and the light output member, and thus, the light output from the light emitting device does not travel to an unintended direction and the directional control of the light can be made easily. Alternatively, there may be an air layer between the light output member and the light emitting device, a light incident lower surface facing the curved part may be provided on the light output member, and light from the light emitting device may enter from the light incident lower surface into the light output member via the air layer. By employing the forms, the light from the light emitting device can be refracted in a direction toward the side of the light output member at a boundary between the light emitting device and the air layer and a boundary between the air layer and the light incident lower surface, and thus, the amount of light toward the side can be increased.

Here, as the light transmissive medium layer, an epoxy resin (refractive index: 1.5), a gelled material [e.g., product name OCK-451 (refractive index: 1.51), product name OCK-433 (refractive index: 1.46) of Nye], silicone rubber, an oil compound material such as silicone oil compound [e.g., product name TSK5353 (refractive index: 1.45) of Toshiba Silicone], which are transparent to the light output from the light emitting device, can be taken as examples. Note that light emitting particles may be mixed in the light transmissive medium layer. By mixing the light emitting particles in the light transmissive medium layer, the range of choices of light emitting devices (the range of choices of wavelengths of emitted light) can be made wider.

As the light emitting particles, red light emitting phosphor particles, green light emitting phosphor particles, and blue light emitting phosphor particles may be cited. Here, a material forming the red light emitting phosphor particles, $Y_2O_3$:Eu, $YVO_4$:Eu, $Y(P,V)O_4$:Eu, $3.5MgO\cdot0.5MgF_2$:$Ge_2$:Mn, $CaSiO_3$: Pb,Mn, $Mg_6AsO_{11}$:Mn, $(Sr,Mg)_3(PO_4)_3$: Sn, $La_2O_2S$:Eu, $Y_2O_2S$:Eu, (ME:Eu)S [note that "ME" refers to at least one kind of atom selected from the group consisting of Ca, Sr and Ba, and the reference is the same in the following description], $(M:Sm)_x(Si,Al)_{12}(O,N)_{16}$ [note that "M" refers to at least one kind of atom selected from the group consisting of Li, Mg and Ca, and the reference is the same in the following description], $ME_2Si_5N_8$:Eu, (Ca:Eu)$SiN_2$, (Ca:Eu)$AlSiN_3$ may be cited. Further, as a material forming the green light emitting phosphor particles, $LaPO_4$:Ce,Tb, $BaMgAl_{10}O_{17}$:Eu,Mn, $Zn_2SiO_4$:Mn, $MgAl_{11}O_{19}$:Ce,Tb, $Y_2SiO_5$:Ce,Tb, $MgAl_{11}O_{19}$:CE, Tb, Mn may be cited, and further, (ME:Eu) $Ga_2S_4$, $(M:RE)_x(Si,Al)_{12}(O,N)_{16}$ [note that "RE" refers to Tb and Yb], $(M:Tb)_x(Si,Al)_{12}(O,N)_{16}$, $(M:Tb)_x(Si,Al)_{12}(O,N)_{16}$ may be cited. Furthermore, as a material forming the blue light emitting phosphor particles, $BaMgAl_{10}O_{17}$:Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWo_4$, $CaWo_4$:Pb may be cited.

Note that the light emitting particles are not limited to the phosphor particles, but light emitting particles formed by applying a quantum well structure such as two-dimensional quantum well structure, one-dimensional quantum well structure (quantum wire), zero-dimensional quantum well structure (quantum dot) by localizing wave function of carrier for efficient conversion of carrier into light and using the quantum effect in a silicon series material of indirect transition type like in the direct transition type may be cited. Further, it is known that rare-earth atoms added to a semiconductor material emit intense light due to intra-shell transition, and light emitting particles employing the technology may be cited.

Furthermore, in the above described light output member and the like of the embodiment of the invention including the preferred configuration and form, the light output member may have a light reflecting lower surface that internally reflects and outputs the light internally reflected on the curved part from the upper surface. In this case, the light reflecting lower surface may be located at an edge part of the light output member and include a tilted surface, and the tilted surface may be tilted downward toward the outside and convex downward. By employing the configuration, the amount of light output from the upper surface can be further increased, and occurrence of luminance irregularities can be effectively suppressed.

A light reflecting film may be formed on the light reflecting lower surface. The light reflecting film may include a sensitized reflecting film, for example. Here, as the sensitized reflecting film, a silver-sensitized reflecting film having a structure with sequentially stacked low-refractive index films and high-refractive index films may be cited, for example. Further, a dielectric multilayer reflecting film having a structure in which several tens of low-refractive index thin films of $SiO_2$ or the like and high-refractive index thin films of $TiO_2$, $Ta_2O_5$, or the like are alternately stacked, an organic polymer multilayer thin film light reflecting film fabricated by stacking polymer films having various refractive indexes and sub-micron thicknesses may be taken as examples. Or, as the light reflecting film, a metal thin film such as a silver thin film, chromium thin film, or aluminum thin film or a metal alloy thin film may be cited. When the light reflecting film has a sheet-like or film-like, plate-like form, the light reflecting film can be fixed on the light reflecting lower surface by a method using a glue, a method of fixing by ultrasonic joining, a method of using an adhesive, or the like. Alternatively, the light reflecting film can be formed on the light reflecting lower surface by a known film forming method such as PVD and CVD using vacuum deposition and sputtering, or the like.

In the above described light output member and the like of the embodiment of the invention including the preferred configuration and form, a relationship between angle $\phi$ and angle $\theta$, a relationship between angle $(\phi+|\Delta\phi|/2)$ and angle $(\theta+\Delta\theta_+)$, a relationship between angle $(\phi-|\Delta\phi|/2)$ and $(\theta+\Delta\theta_-)$ can be obtained based on the incident angle of the light output from the light emitting device and entering the light output member, the refractive index of the medium immediately before entering the light output member, the refractive index of the light output member, the output angle of the light output from the curved part of the light output member, etc. Further, the locus of an edge of the curved part forms a circle or oval around the curved part center axis. When the locus of the edge of the curved part forms an oval, it is desirable that the X-axis is in parallel to the long axis of the oval or in parallel to the short axis of the oval. The edge of the curved part may be located inside of the edge of the upper surface of the light output member (i.e., the edge of the light output member) or may be the edge of the upper surface of the light output member (i.e., the edge of the light output member). In the former case, regarding the region of the upper surface of the light output member located outside of the edge of the curved part, the section cut along a virtual plane containing the Z-axis is expressed by a line segment, a combination of line segments or a combination of a line segment and a curve, or a curve expressed by a function different from the curved surface. The function $F(\phi,\Delta\phi)$ monotonously increases, takes the maximum value at $\phi=\phi_0$ ($<0$), and then, monotonously decreases as the value of $\phi$ increases from the minimum value. Generally, the function $F(\phi,\Delta\phi)$ monotonously increases in a convex downward condition, via a point of inflexion, increases in a convex upward condition, takes the maximum value at $\phi=\phi_0$ ($<0$), and then, monotonously decreases in a convex upward condition, via a point of inflexion, increases in a convex downward condition, as the value of $\phi$ increases from the minimum value.

In the above described light output member of the embodiment of the invention including the preferred configuration and form, the light emitting device assembly of the embodiment of the invention, the light output member in the surface light source device according to the first embodiment or second embodiment of the invention, the liquid crystal display device assembly according to the first embodiment or second embodiment of the invention (hereinafter, these may be collectively and simply referred to "the embodiment of the invention"), the light emitting device may include a base and a light emitting diode (LED) having a light emitting layer formed on the base, and the light output member may face the light emitting layer forming the light emitting diode (face-up structure). Alternatively, the light emitting device may include a base and a light emitting diode having a light emitting layer formed on the base, and the light output member may face the base (flip-chip structure). In the flip-chip structure, light is output via the base.

For example, the light emitting diode (LED) has a laminated structure of a first compound semiconductor layer having a first conductivity type (e.g., n-type) formed on a base, an active layer formed on the first compound semiconductor layer, and a second compound semiconductor layer having a second conductivity type (e.g., p-type) formed on the active layer, and a first electrode electrically connected to the first compound semiconductor layer and a second electrode electrically connected to the second compound semiconductor layer. The layers forming the light emitting diode may include known compound semiconductor materials depending on wavelengths of emitted light, and the base may include a known material, for example, sapphire (reflective index: 1.785), GaN (reflective index: 2.438), GaAs (reflective index: 3.4), AlInP (reflective index: 2.86), alumina (reflective index: 1.78), or the like.

Generally, the color temperature of the light emitting diode depends on the active current. Accordingly, in order to faithfully reproduce colors while obtaining desired luminance, that is, to maintain the color temperature constant, it is preferable that the light emitting diode is driven by a pulse width modulation (PWM) signal. When the duty ratio of the pulse width modulation (PWM) signal is changed, the average change of forward current and luminance in the light emitting diode changes linearly.

The light emitting device is typically attached to a substrate. Here, it is preferable that the substrate is not limited but a substrate having resistance to heat generated by the light emitting device and good heat dissipation. Specifically, as the substrate, a metal core printed wiring board having wiring formed on one side or both sides, a multilayer metal core printed wiring board, a metal base printed wiring board having wiring formed on one side or both sides, a multilayer metal base printed wiring board, a ceramics wiring board having wiring formed on one side or both sides, and a multilayer ceramics wiring board may be taken as examples. The method of manufacturing these various printed wiring boards may be a method in the related art. Further, as a method of electrically connecting the light emitting device and the circuit formed on the substrate (a mounting method), though depending on the structure of the light emitting device, a die bonding method, a wire bonding method, and a combination of the methods and a system using a submount may be cited. As the die bonding method, a method using solder balls, a method using solder paste, a method of bonding by melting AuSn eutectic solder, and a method of forming a gold bump and jointing using ultrasonic waves may be cited. The method of mounting the light emitting device to the substrate may be a known mounting method. Further, it is desirable that the substrate is fixed to a heat sink.

In the embodiment of the invention, given that the refractive index of the material forming the light output member is $n_1$, it is desirable that $1.35 \leq n_1 \leq 2.5$, preferably $1.4 \leq n_1 \leq 1.8$. Here, as the material forming the light output member, a material used for spectacles lens may be cited, and various kinds of plastic of a plastic material such as product name Prestige (refractive index: 1.74) of Seiko Optical Products, product name ULTIMAX V AS1.74 (refractive index: 1.74) of SHOWA OPT, product name NL5-AS (refractive index: 1.74) of Nikon Essilor, PMMA, polycarbonate resin, acrylic resin, amorphous polypropylene resin, styrene resin containing AS resin, "ZEONOR" manufactured by Zeon as a norbornene polymer resin may be cited. Further, optical glass such as glass materials manufactured by HOYA of NBFD11 (refractive index $n_1$: 1.78), M-NBFD82 (refractive index $n_1$: 1.81), M-LAF81 (refractive index $n_1$: 1.73), and inorganic dielectric materials such as $KTiOPO_4$ (refractive index $n_1$: 1.78) and lithium niobate [$LiNbO_3$] (refractive index $n_1$: 2.23) may be cited. When the light output member is formed from an injection moldable thermoplastic material, the light output member may be molded by injection molding.

The light output from the light emitting device enters from the lower surface facing the curved part of the light output member into the light output member, and the lower surface may be flat or a recessed part may be formed on the lower surface. The light emitting device may be located below the lower surface, may be located at the same level as the lower surface, or may be located within the recessed part provided in the lower surface. The light emitting device may be sealed by a sealing resin made of silicone resin (e.g., refractive index: 1.41 to 1.50) or epoxy resin (e.g., refractive index: 1.40 to 1.60), for example. Alternatively, the light output member may be fabricated from silicone resin or epoxy resin so that the light output member may function as a sealing member, and the light emitting device may be covered by the light output member without gaps.

In the surface light source device, plural red light emitting device assemblies that emit red light (e.g., wavelength 640 nm), plural green light emitting device assemblies that emit green light (e.g., wavelength 530 nm), or blue light emitting device assemblies that emit blue light (e.g., wavelength 450 nm) are provided and arranged within a casing. As the arrangement condition of the light emitting device assemblies, an arrangement in which plural light emitting device assembly units each including one set of the red light emitting device assembly, the green light emitting device assembly, and the blue light emitting device assembly are arranged in the horizontal direction of the screen of the liquid crystal display device to form a light emitting device assembly array, and plural light emitting device assembly arrays are arranged in the vertical direction of the screen of the liquid crystal display device may be taken as an example. Note that, as the light emitting device assembly unit, as described above, combinations of (one red light emitting device assembly, one green light emitting device assembly, and one blue light emitting device assembly) and (one red light emitting device assembly, two green light emitting device assemblies, and one blue light emitting device assembly) may be cited. A light emitting device assembly that emits light of the fourth color other than three primary colors of red, green, and blue may be further provided.

The surface light source device may include not only the light diffuser plate but also a group of optical functional sheets (films) of a light diffuser sheet, prism sheet (film), BEF and DBEF (these are product names of Sumitomo 3M), and polarization converter sheet (film) or a reflector sheet.

As the liquid crystal display device, a color transmissive or semi-transmissive color liquid crystal display device may be cited. The liquid crystal display device includes a front panel having a transparent first electrode, a rear panel having a transparent second electrode, and a liquid crystal material provided between the front panel and the rear panel, for example.

More specifically, the front panel includes a first substrate of a glass substrate or silicon substrate, the transparent first electrode (also referred to a common electrode, made of ITO, for example) provided on the inner surface of the first substrate, and a polarizing film provided on the outer surface of the first substrate, for example. Further, a color filter covered by an overcoating layer of an acryl resin or epoxy resin is provided on the inner surface of the first substrate, and the transparent first electrode is formed on the overcoating layer. An alignment film is formed on the transparent first electrode. As a layout pattern of the color filter, a delta layout, stripe layout, diagonal layout, or rectangle layout may be cited. On the other hand, more specifically, the rear panel includes a second substrate of a glass substrate or silicon substrate, switching elements formed on the inner surface of the second substrate, transparent second electrodes (also referred to as pixel electrodes, made of ITO, for example) controlled into or out of conduction by the switching elements, and a polarizing film provided on the outer surface of the second substrate, for example. An alignment film is formed on the entire surface containing the transparent second electrodes. The various kinds of members and the liquid crystal material forming the transmissive or semi-transmissive color liquid crystal display device may be known members and materials. As the switching element, a three-terminal element such as a MOSFET formed on a single crystal silicon semiconductor substrate or a thin film transistor (TFT) formed on a glass substrate and a two-terminal element such as an MIM element, varistor element, or diode may be taken as an example.

The surface light source device according to the first embodiment or second embodiment of the invention includes plural surface light source units. That is, the plural surface light source units may include, assuming that the display area of the color liquid crystal display device is segmented into P×Q virtual display area units, P×Q surface light source units corresponding to the P×Q display area units, and the light sources (light emitting device assembly units) provided in the surface light source unit may be individually controlled. Such a configuration may be referred to as a surface light source device of segmented drive system for convenience.

In the surface light source device of segmented drive system, one or plural light emitting device assembly units are provided on one surface light source unit. It is desirable that a photosensor for measurement of light emission statuses of light emitting devices (specifically, for example, luminance of light sources, chromaticity of light sources, or luminance and chromaticity of light sources) is provided. At least one photosensor may be provided, however, it is desirable that one photosensor is provided for one surface light source unit in view of reliable measurement of the light emission statuses of the respective surface light source units. As the photosensor, a known photodiode, CCD device, or the like may be cited.

In the segmented drive system, light transmittance (also referred to as aperture ratio) Lt of a subpixel, luminance of a part of the display area corresponding to the subpixel (display luminance) sy, and luminance (light source luminance) SY of a surface light source unit are defined as follows.

$SY_1$: light source luminance, e.g., the highest luminance, which may be referred to as light source luminance first preset value.

$Lt_1$: light transmittance (aperture ratio) of a subpixel in the display area unit, e.g., the maximum value, which may be referred to as the light transmittance first preset value.

$Lt_2$: light transmittance (aperture ratio) of a subpixel, assuming that the light source luminance is the light source luminance first preset value $SY_1$ and a control signal corresponding to a drive signal having a value equal to the drive signal maximum value $sx_{U-max}$ within display area unit as the maximum value of the values of the drive signals to be input to the drive circuits for driving all pixels forming the display area unit is supplied to the pixel, which may be referred to as the light source luminance second preset value. Here, $0 \leq Lt_2 \leq Lt_1$).

$sy_2$: display luminance obtained assuming that the light source luminance is the light source luminance first preset value $SY_1$ and the light transmittance (aperture ratio) is the light source luminance second preset value $Lt_2$, which may be referred to as the display luminance second preset value.

$SY_2$: light source luminance of the surface light source unit so that the luminance of the subpixel is the display luminance second preset value ($sy_2$), assuming that a control signal corresponding to the drive signal having a value equal to the drive signal maximum value $sx_{U-max}$ within display area unit is supplied to the subpixel and the light transmittance (aperture ratio) of the subpixel is corrected to the light transmittance first preset value $Lt_1$. Note that correction in consideration of the influence affected by each surface light source unit on the other surface light source unit may be performed on the light source luminance $SY_2$.

The luminance of the light source (light emitting device assembly unit) forming the surface light source unit corresponding to the display area unit is controlled by the drive circuit so that luminance of the pixel (display luminance second preset value $sy_2$ at the light transmittance first preset value $Lt_1$) assuming that a control signal corresponding to the drive signal having a value equal to the drive signal maximum value $sx_{U-max}$ within display area unit as the maximum value of the values of the drive signals is supplied to the pixel at segmented drive of the surface light source device. Specifically, the light source luminance $SY_2$ may be controlled (may be reduced, for example) so that the display luminance $sy_2$ may be obtained when the light transmittance (aperture ratio) of the subpixel is set to the light transmittance first preset value $Lt_1$, for example. That is, for example, the light source luminance $SY_2$ of the surface light source unit may be controlled to satisfy the following equation (A) with respect to each frame (referred to as image display frame for convenience) in image display of the liquid crystal display device. Here, there is a relationship of $SY_2 \leq SY_1$.

$$SY_2 \cdot Lt_1 = SY_1 \cdot Lt_2 \qquad (A)$$

The drive circuit may include a surface light source device control circuit and surface light source unit drive circuit having a pulse width modulation (PWM) signal generation circuit, duty ratio control circuit, light-emitting device drive circuit, arithmetic circuit, storage device (memory), etc., and a liquid crystal display device drive circuit having a known circuit such as a timing controller.

When the luminance of the light source (light emitting device assembly unit) forming the surface light source unit corresponding to the display area unit is controlled by the drive circuit so that luminance of the pixel (display luminance second preset value $sy_2$ at the light transmittance first preset value $Lt_1$) assuming that a control signal corresponding to the drive signal having a value equal to the drive signal maximum value $sx_{U-max}$ within display area unit as the maximum value of the values of the drive signals is supplied to the pixel is obtained employing the segmented drive system (partial drive system) in the surface light source unit, not only the power consumption of the surface light source device can be reduced but also increase in the white level and decrease in the black level can be achieved, the high contrast ratio (the luminance ratio between all black display parts and all white display parts containing no outside light or the like on the screen surface of the liquid crystal display device) can be obtained, and brightness of the desired display area can be intensified, and therefore, the image quality in image display can be improved.

As application fields of the surface light source device of the embodiment of the invention, not only the above described liquid crystal display device assembly but also lighting tools and lamps in transportation means such as cars, trains, ships, airplanes, etc. (e.g., headlight, taillight, high-mount stoplight, small light, turn-signal lamp, fog light, interior lamp, meter panel light, light sources in various buttons, destination lamp, emergency lamp, emergency exit lamp, etc.), various lighting tools and lamps in buildings (outdoor light, interior light, illumination lamp, emergency lamp, emergency exit lamp, etc.), street light, various display lighting tools such as traffic light, advertizing sign, machines, equipment, etc., illumination lamp and daylighting unit in tunnels, underground passage ways, etc. may be cited.

In the light output member of the embodiment of the invention and the like, the value of the x coordinate of the curved part center axis is a positive value, and further, the function $F(\phi, \Delta\phi)$ monotonously increases, takes the maximum value at $\phi = \phi_0$ (<0), and then, monotonously decreases as the value of $\phi$ increases from the minimum value. Therefore, it is ensured that the light having the maximum light intensity is output in a desired direction (specifically, in the direction at the output angle of $\theta_{I-max}$), and further, many light beams are output in the horizontal direction as well. Consequently, even when, using red light emitting device assemblies including red light emitting devices, green light emitting device assemblies including green light emitting devices, and blue light emitting device assemblies including blue light emitting devices, red, green and blue output from the light emitting devices are mixed, color irregularities and luminance irregularities are hard to occur.

BRIEF DESCRIPTION OF THE DRAWINGS

FIG. 14 is a schematically partial sectional view of a surface light source device and a color liquid crystal display device assembly of working examples 3 to 5.

FIG. 20 is a conceptual diagram of a color liquid crystal display device assembly including a color liquid crystal display device and a surface light source device suitable for use in working examples.

DESCRIPTION OF PREFERRED INVENTION

Hereinafter, preferred working examples of the invention will be explained with reference to the drawings.

WORKING EXAMPLE 1

Figure 1:
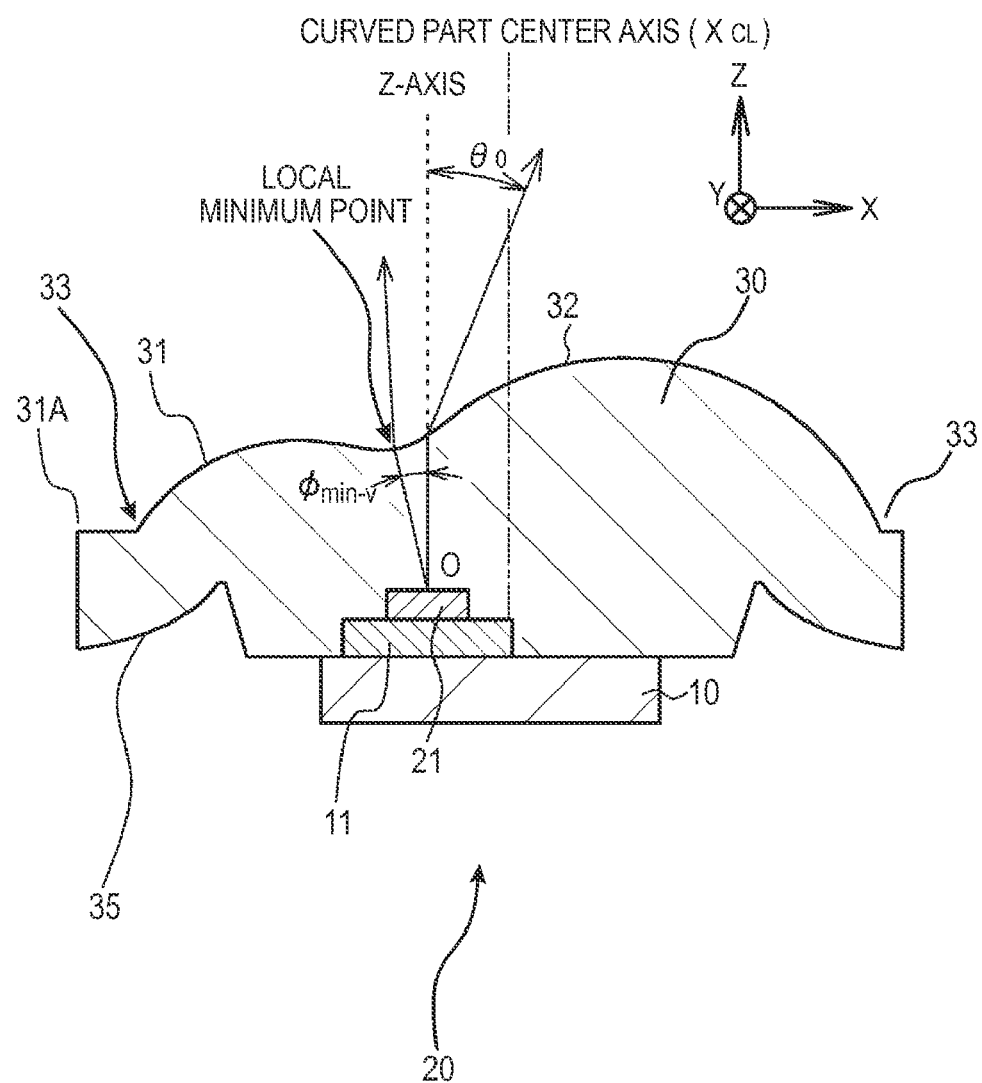
FIG. 1 is a schematic sectional view of a light output member and a light emitting device assembly of working example 1.
Figure 2:
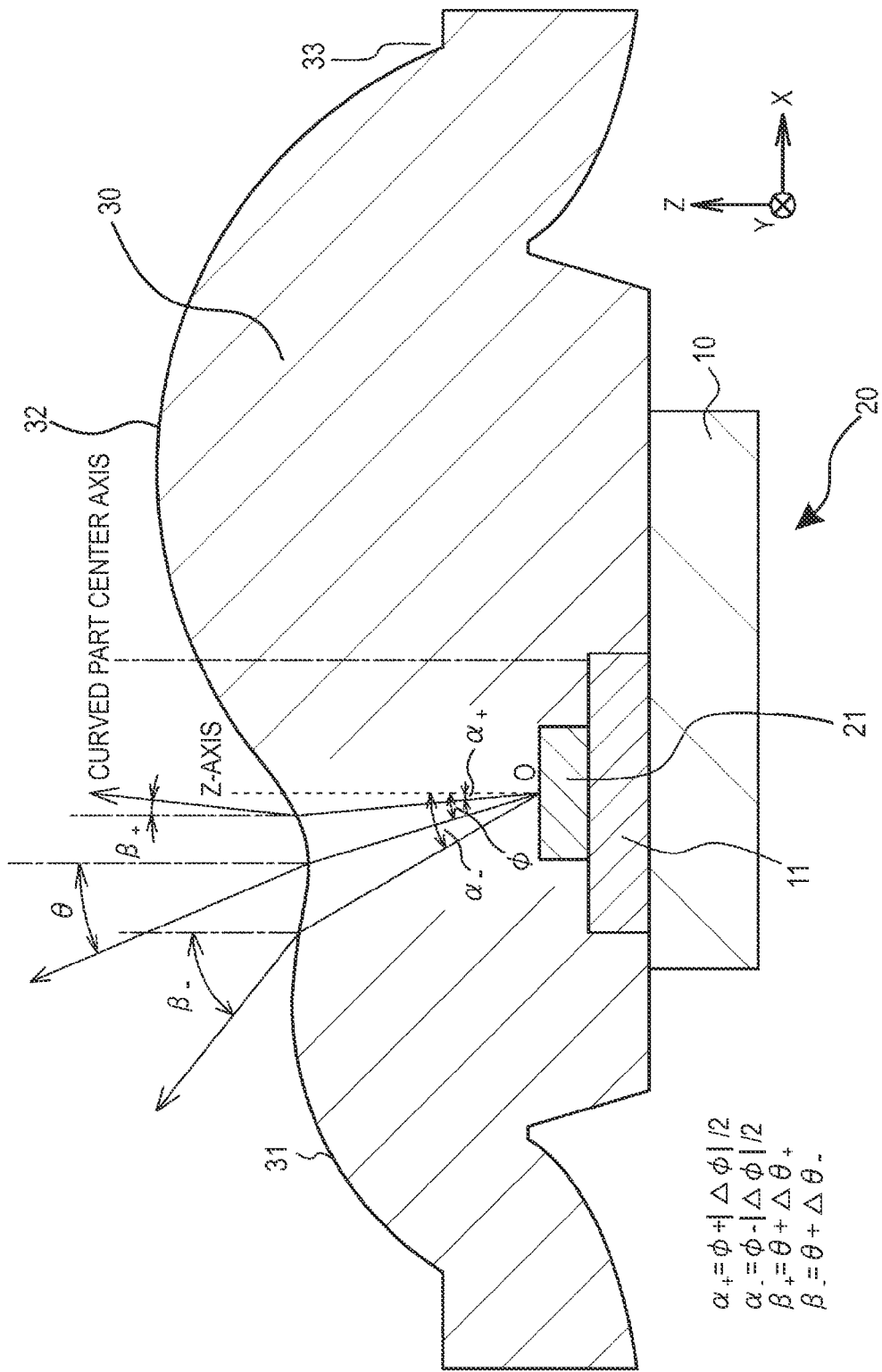
FIG. 2 is a schematic enlarged sectional view of the light output member and the light emitting device assembly of working example 1 shown in FIG. 1.
Figure 3:
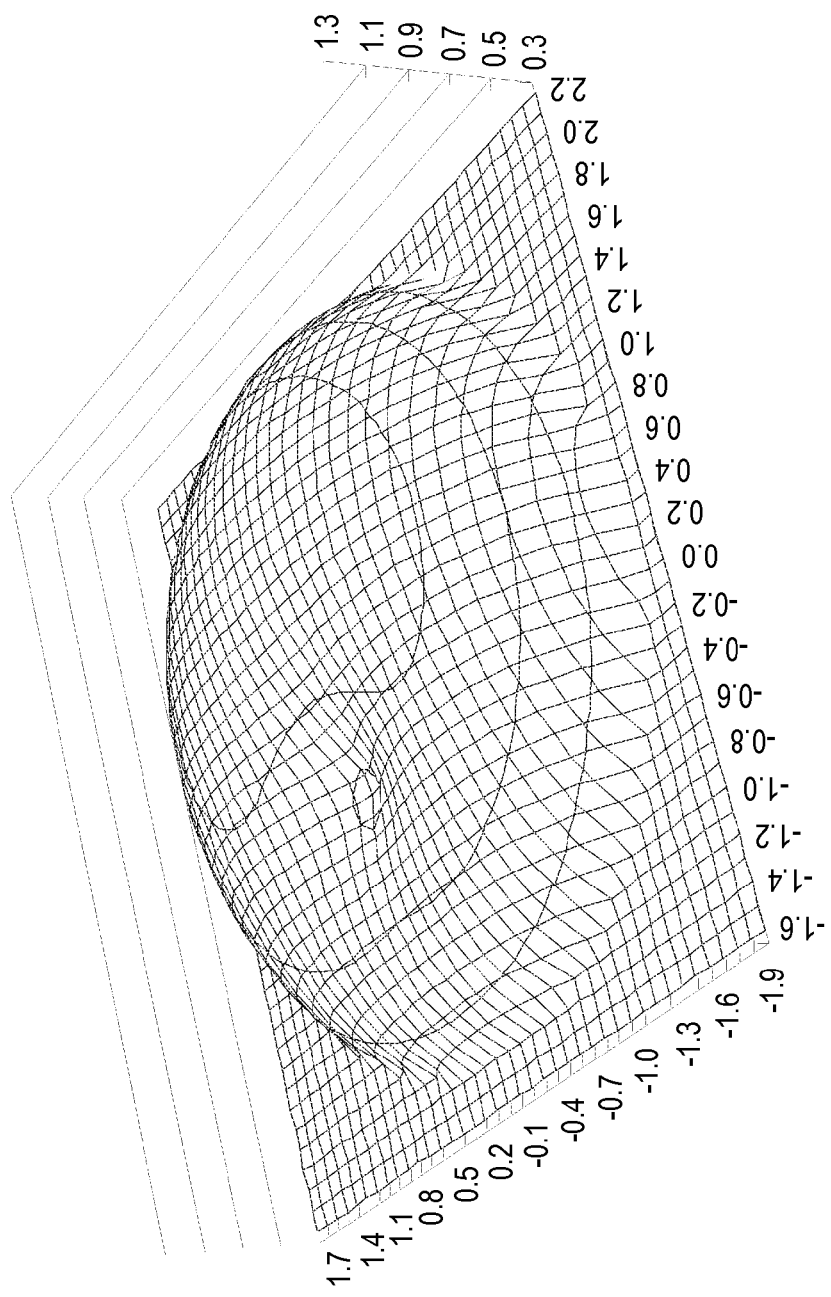
FIG. 3 shows a three-dimensional shape of the light output member of working example 1.
Figure 4A:
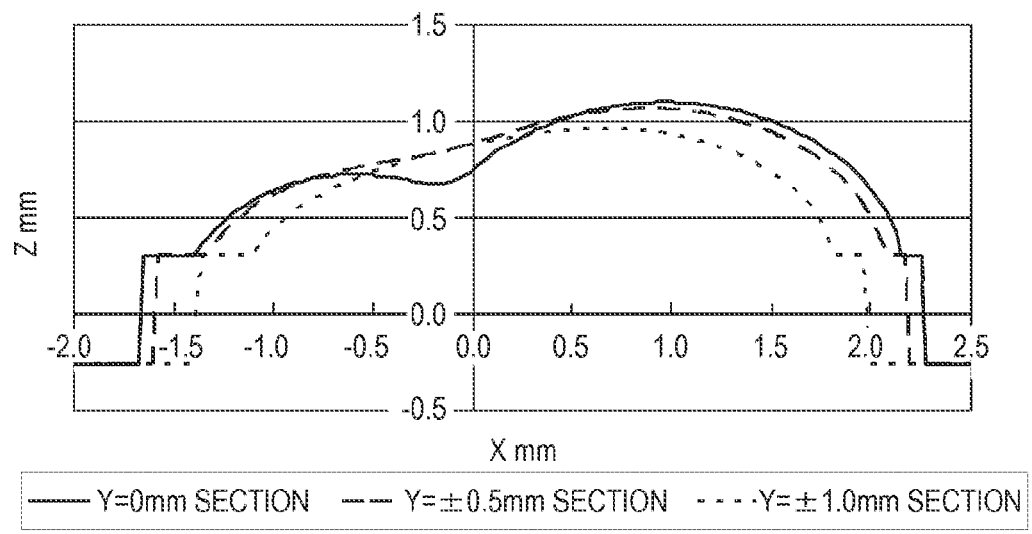
FIG. 4A shows an outline of an upper surface of the light output member when the light output member of working example 1 is cut along an XZ-plane (y=0 mm), an outline of the upper surface of the light output member when the light output member of working example 1 is cut along an XZ-plane (y=±0.5 mm), and an outline of the upper surface of the light output member when the light output member of working example 1 is cut along an XZ-plane (y=±1.0 mm).
Figure 4B:
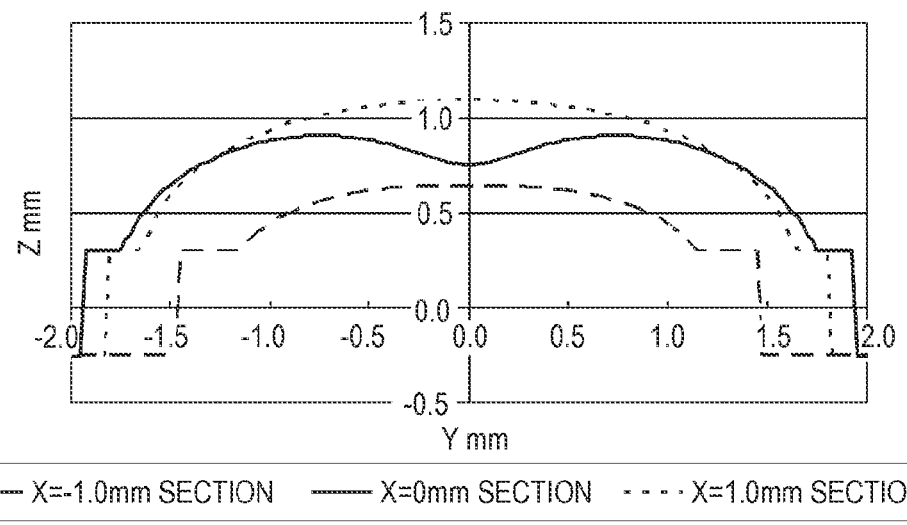
FIG. 4B shows an outline of the upper surface of the light output member when the light output member of working example 1 is cut along a YZ-plane (x=0 mm), an outline of the upper surface of the light output member when the light output member of working example 1 is cut along a YZ-plane (x=−1.0 mm), and an outline of the upper surface of the light output member when the light output member of working example 1 is cut along a YZ-plane (x=1.0 mm).

Working example 1 relates to a light output member and a light emitting device assembly of an embodiment of the invention. FIG. 1 is a schematic sectional view of a light output member and a light emitting device assembly of working example 1. Further, for explanation, FIG. 2 is an enlarged schematic sectional view of FIG. 1, and FIG. 3 shows a three-dimensional shape of the light output member of working example 1. Furthermore, FIG. 4A shows an outline of the upper surface of the light output member when the light output member of working example 1 is cut along the XZ-plane (y=0 mm), an outline of the upper surface of the light output member when the light output member of working example 1 is cut along the XZ-plane (y=±0.5 mm), and an outline of the upper surface of the light output member when the light output member of working example 1 is cut along the XZ-plane (y=±1.0 mm) by a solid line, a broken line, a dotted line, respectively, and FIG. 4B shows an outline of the upper surface of the light output member when the light output member of working example 1 is cut along the YZ-plane (x=0 mm), an outline of the upper surface of the light output member when the light output member of working example 1 is cut along the YZ-plane (x=−1.0 mm), and an outline of the upper surface of the light output member when the light output member of working example 1 is cut along the YZ-plane (x=1.0 mm) by a solid line, a broken line, a dotted line, respectively.

The light output member 30 of working example 1 is a light output member provided on a light emitting device 21 and has an upper surface 31 on which a curved part 32 that outputs light from the light emitting device 21 is provided. Further, a light emitting device assembly 20 of working example 1 includes:

(A) the light emitting device 21; and (B) the light output member 30 provided on the light emitting element 21 and having the upper surface 31 on which the curved part 32 that outputs light from the light emitting device 21 is provided.

Further, (i) an axis line passing through the center of the curved part 32 and being in parallel with a normal line of a light exit surface of the light emitting device 21 is a Curved part center axis. Furthermore, (ii) an orthogonal coordinate system (x, y, z) in a three-dimensional space with the normal line of the light exit surface of the light emitting device 21 passing through the center of the light emitting device 21 as the Z-axis, a plane containing the curved part center axis and the Z-axis as the XZ-plane, a point at which the Z-axis and the light exit surface of the light emitting device 21 intersects as the origin O is assumed. Additionally, (iii) when the light output from the curved part 32 travels in a positive direction of the X-axis within the XZ-plane, an angle formed by the traveling direction of the light and the Z-axis takes a positive value. Further, (iv) the light output from the origin O at an angle $\phi$ formed with the Z-axis within the XZ-plane is output from the curved part 32 at an angle $\theta$ formed with the Z-axis within the XZ-plane. Furthermore, (v) the light output from the origin O at an angle $(\phi+|\Delta\phi|/2)$ [$\equiv\alpha_+$] formed with the Z-axis within the XZ-plane is output from the curved part 32 at an angle $(\theta+\Delta\theta_+)$ [$\equiv\beta_+$] formed with the Z-axis within the XZ-plane. Additionally, (vi) the light output from the origin O at an angle $(\phi-|\Delta\phi|/2)$ [$\equiv\alpha^-$] formed with the Z-axis within the XZ-plane is output from the curved part 32 at an angle $(\theta+\Delta\theta_-)$ [$\equiv\beta_-$] formed with the Z-axis within the XZ-plane. Note that the value of $|\Delta\theta_+|$ and the value of $|\Delta\theta_-|$ are generally not equal.

In the light output member 30 of working example 1, the value of the x coordinate $(x_{CL})$ of the curved part center axis is a positive value. Further, the locus of an edge 33 of the curved part 32 forms a circle or oval around the curved part center axis. Furthermore, the light on the Z-axis output from the origin O is output from the curved part 32 at an angle $\theta_0$ ($\theta_0>0$) formed with the Z-axis within the XZ-plane. Function $F(\phi,\Delta\phi)$ expressed by $$F(\phi,\Delta\phi)=(\Delta\theta_+-\Delta\theta_-)/\Delta\phi \quad (1)$$

monotonously increases, takes the maximum value at $\phi=\phi_0$ (<0), and then, monotonously decreases as the value of $\phi$ increases from the minimum value. That is, as the value of $\phi$ increases from the minimum value, the function monotonously increases in a convex downward condition, passes a point of inflexion, increases in a convex upward condition, takes the maximum value at $\phi=\phi_0$ (<0), then, monotonously decreases in a convex upward condition, passes a point of inflexion, and monotonously decreases in a convex downward condition.

More specifically, the locus of the edge 33 of the curved part 32 is a circle having a diameter of 3.5 mm around the curved part center axis. In working example 1, the edge 33 of the curved part 32 is located inside of an edge 31A of the upper surface 31 of the light output member 30 (i.e., an edge of the light output member 30). Regarding the region of the upper surface 31 of the light output member 30 located outside of the edge 33 of the curved part 32, the section cut along a virtual plane containing the Z-axis is expressed by a combination of a horizontal line segment and a nearly vertical line segment. Further, the value of the x coordinate $(x_{CL})$ of the curved part center axis is 0.38 mm. In the light output member 30 of working example 1, the curved part 32 has a non-rotationally symmetric shape with respect to the Z-axis, but is symmetric with respect to the XZ-plane. Furthermore, the light output member 30 includes a silicone resin having a refractive index $n_1$ of 1.41 and molded by a transmolding method. Here, the light output member 30 also has a function of sealing the light emitting device 21 and the light emitting device 21 is covered by the light output member 30 without gaps.

Figure 7:
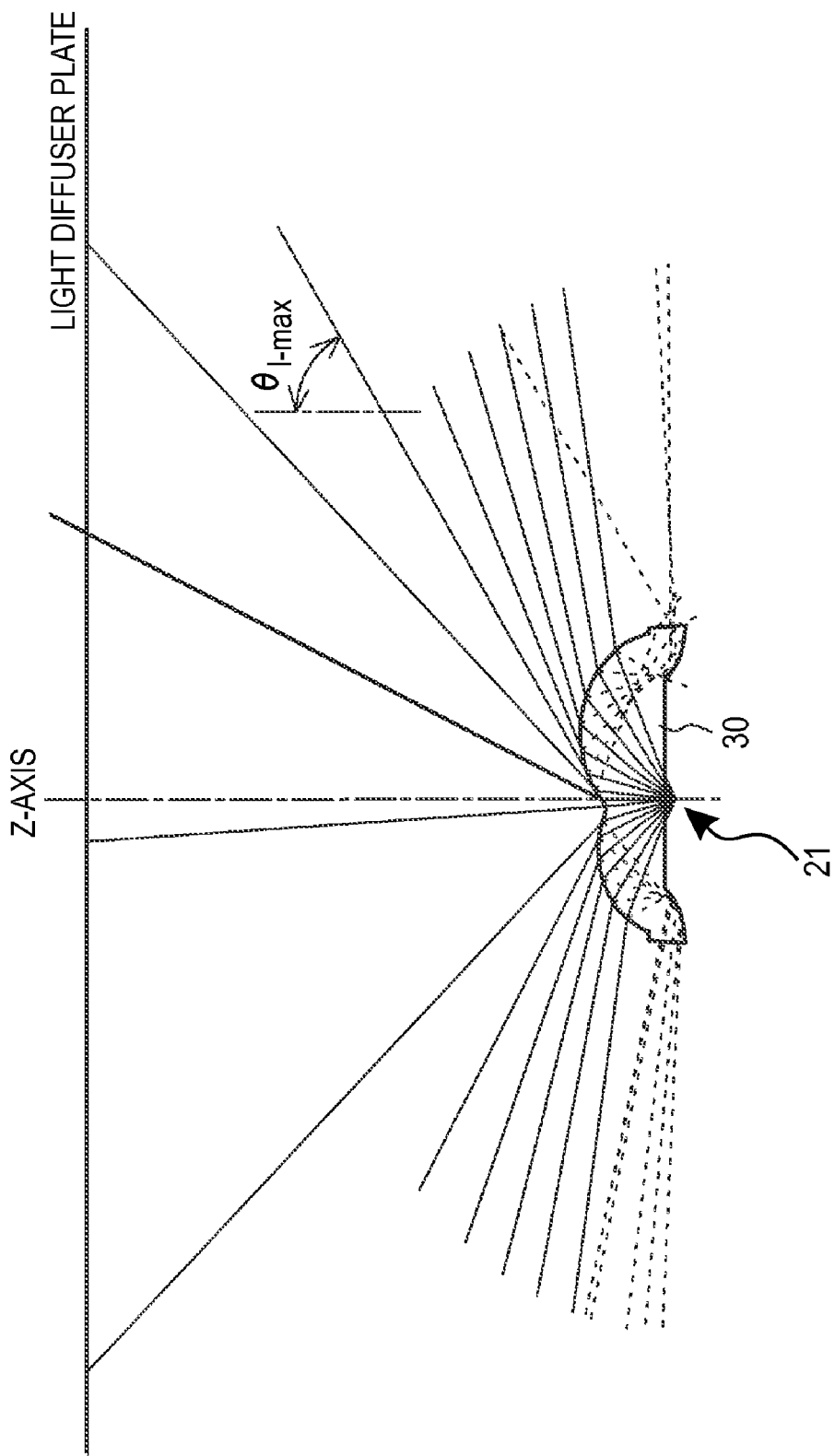
FIG. 7 schematically shows light output from the light emitting device assembly.
Figure 12A:
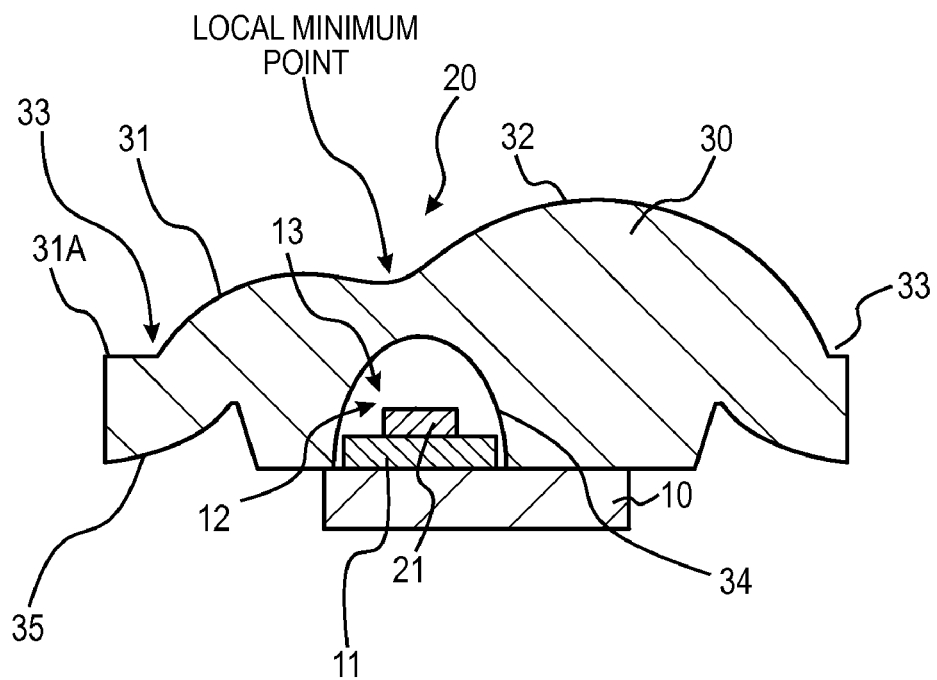
FIGS. 12A and 12B are schematic sectional views of the light output member of working example 1 and a modified example of the light emitting device assembly.
Figure 12B:
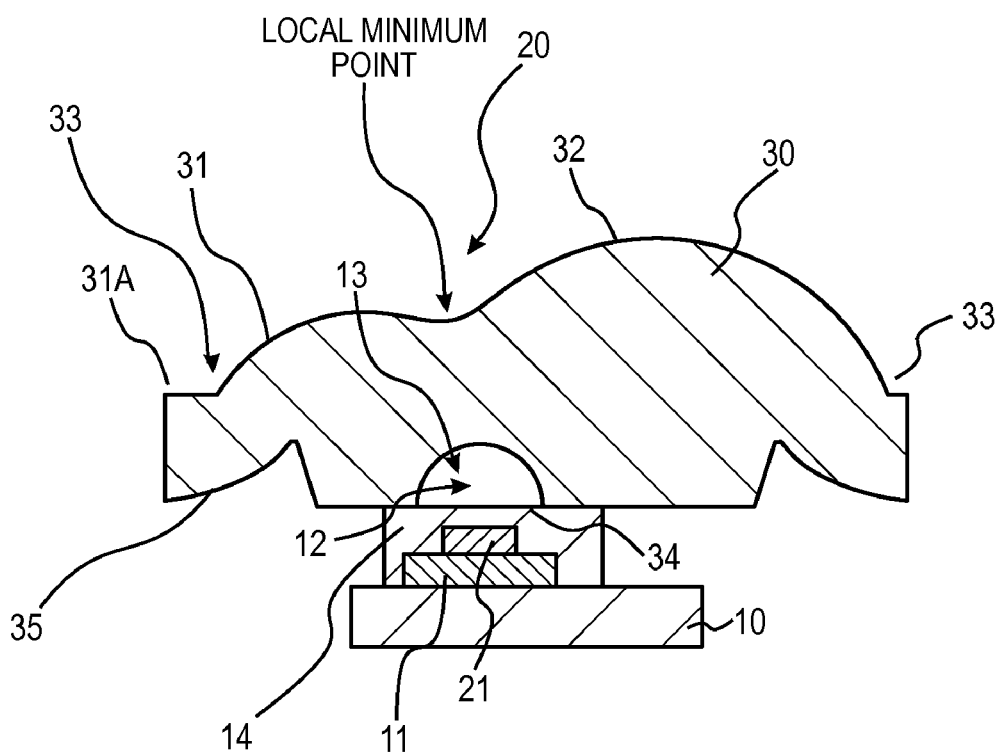

In working example 1, as described above, the light emitting device 21 is covered by the light output member 30 without gaps. Note that, as shown in FIG. 12A, a configuration and structure in which there is an air layer 12 between the light output member 30 and the light emitting device 21, a light incident lower surface 34 facing the curved part 32 is provided on the light output member 30, a recessed part 13 is provided on the light incident lower surface 34, and the light emitting device 21 is provided within the recessed part 13 may be employed, or, as shown in FIG. 12B, the light emitting device 21 sealed by a sealing member 14 may be provided under the light incident lower surface 34 of the light output member 30. In working example 1, the light from the light emitting device 21 directly enters the light output member 30. Further, the light output member 30 has a light reflecting lower surface 35 that internally reflects and outputs the light internally reflected on the curved part 32 from the upper surface 31. The light reflecting lower surface 35 is located at the edge part of the light output member 30 and includes a tilted surface, and the tilted surface is tilted downward toward the outside and convex downward. By employing the configuration, as schematically shown in FIG. 7 by dotted lines, the light output from the light emitting device 21 is easily output from the light output member 30 in the horizontal direction, and the homogeneous luminance can be secured and the luminance irregularities can be suppressed.

In working example 1, the light emitting device 21 includes a base (not shown in FIGS. 1 and 2) and a light emitting diode (LED) having a light emitting layer formed on the base (not shown in FIGS. 1 and 2). A configuration in which the light output member 30 faces the light emitting layer forming the light emitting diode (face-up structure), or a configuration in which the light output member 30 faces the base and light enters the light output member 30 via the base (flip-chip structure) may be employed. The light emitting diode (LED) has a known configuration and structure. Further, the light emitting device 21 is mounted on a submount 11 and the submount 11 is fixed to a substrate 10. As the light emitting diode, a red light emitting diode that emits red light (e.g., wavelength 640 nm), a green light emitting diode that emits green light (e.g., wavelength 530 nm), or a blue light emitting diode that emits blue light (e.g., wavelength 450 nm) may be cited.

In the light output member 30 in working example 1, for example, as shown in FIG. 3, the curved part 32 has a concave surface and a convex surface continuous from the concave surface. Further, as shown in FIG. 1, an angle $\phi_{min-v}$ formed by the local minimum point of the concave surface and the origin satisfies $\phi_{min-v} < \phi_0$. Specifically, the value of the x coordinate of the local minimum point is negative (x=−0.17 mm). Further, a curve obtained when the curved part 32 is cut along an arbitrary virtual plane containing the normal line of the light exit surface of the light emitting device 21 and passing through the local minimum point of the concave surface, from the local maximum point as the starting point, monotonously increases from a convex downward condition via a point of inflexion into a convex upward condition, passes through the local maximum point, and monotonously decreases in a convex upward condition.

Alternatively, in the light output member 30 in working example 1, a curve obtained when the curved part 32 is cut along the XZ-plane includes a first curve having a first local maximum value in a convex upward condition, a second curve smoothly connected to the first curve (i.e., via a point of inflexion) and having a local minimum value in a convex downward condition, and a third curve smoothly connected to the second curve (i.e., via a point of inflexion) and having a second local maximum value in a convex upward condition, as the value of the x coordinate increases from the minimum value. Further, the second maximum value is larger than the first maximum value. Specifically, the value of (the second maximum value−the minimum value) is (the second maximum value−the minimum value) =0.42 mm at x=0.97 mm, (the first maximum value−the minimum value) is (the first maximum value−the minimum value)=0.05 mm for x=−0.59 mm.

Figure 5:
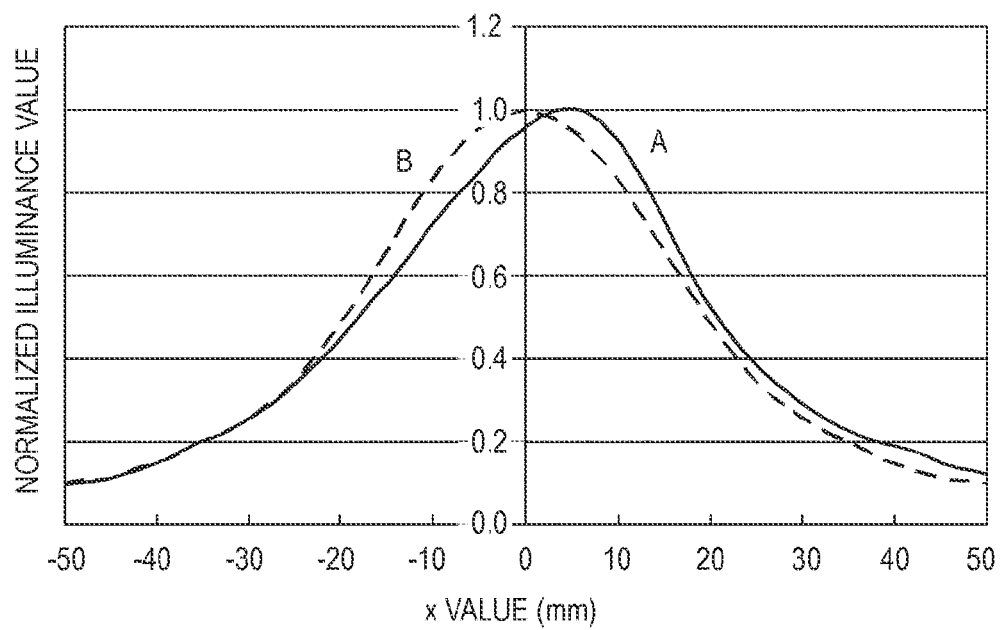
FIG. 5 is a graph showing a relationship between x coordinate within the XZ plane and normalized illuminance in the light output member in working example 1.
Figure 25A:
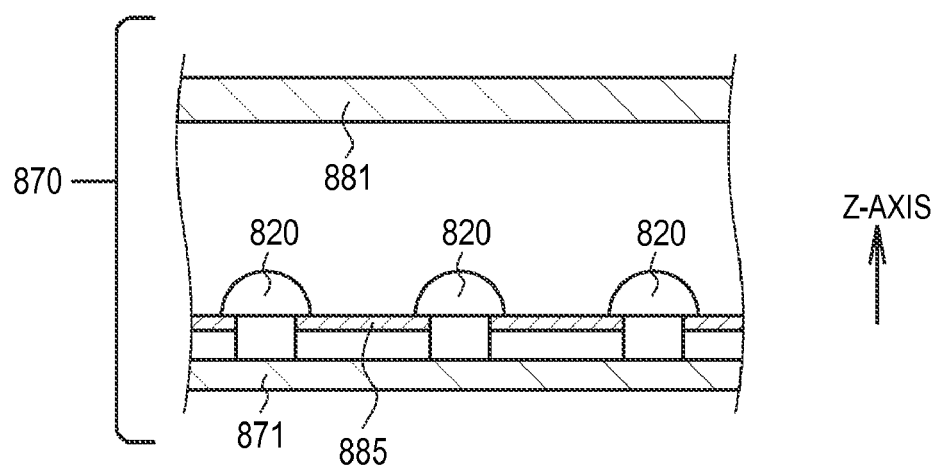
FIGS. 25A and 25B are schematic partial end surface diagrams of a surface light source device in the past.
Figure 25B:
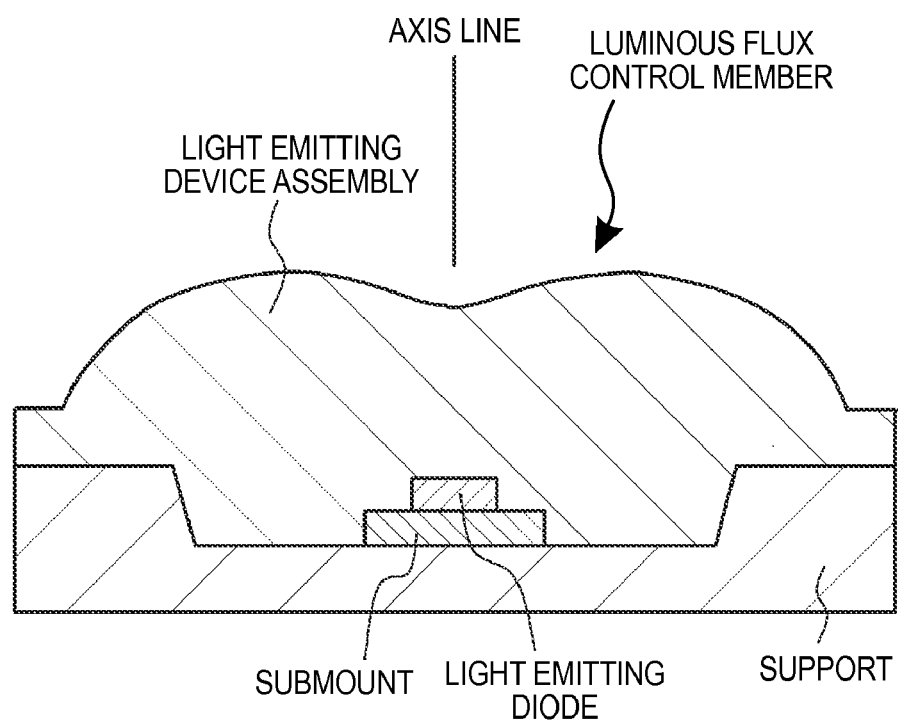

FIG. 5 shows a relationship between the x coordinate within the XZ plane and the normalized illuminance. In the light output member 30 in working example 1, as shown by a solid line of "A", the value of $x_{I-max}$ coordinate at a point where light having the maximum light intensity is output from the curved part 32 within the XZ-plane is a positive value. That is, in the light emitting device assembly 20 of working example 1, the brightest beam is output obliquely upward in the positive direction on the X-axis within the XZ-plane (see the beam showing the illuminance distribution center of FIG. 7). Given that an angle formed by the light having the maximum light intensity with the Z-axis is $\theta_{I-max}$ within the XZ-plane, the $\theta_{I-max}$ is from 70 degrees to 80 degrees. In FIG. 5, the light output member and the light emitting device assembly of comparative example 1 shown by a dotted line of "B" have a configuration and structure shown in FIG. 25B.

Figure 6:
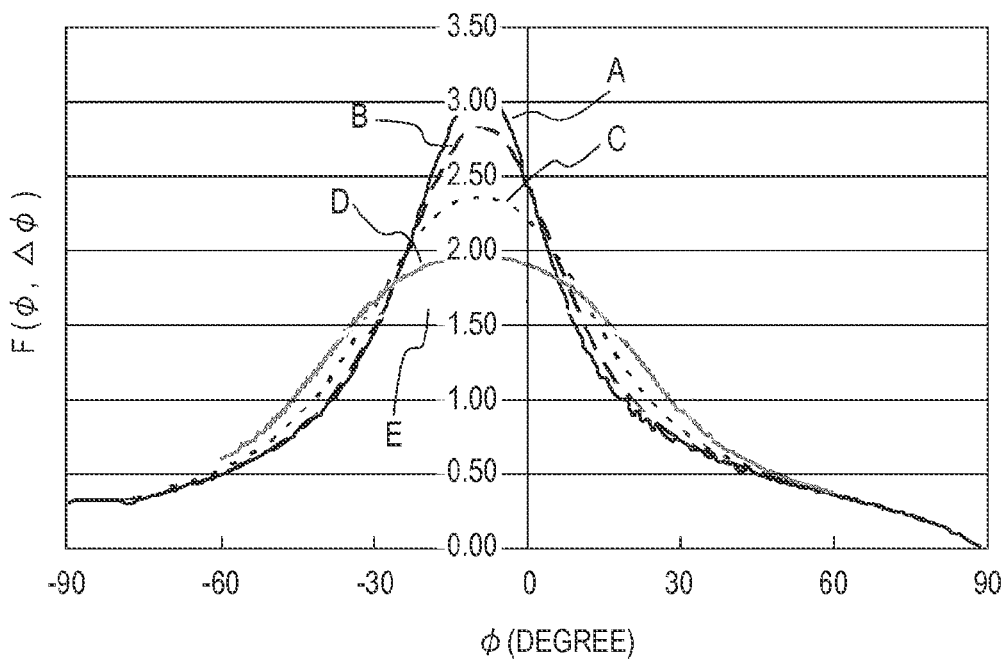
FIG. 6 is a graph showing results of obtaining values of $F(\phi,\Delta\phi)$ when the value of $\Delta\phi$ is set to 1 degree, 20 degrees, 40 degrees, 60 degrees, and 80 degrees in the light output member in working example 1.

FIG. 6 shows results of obtaining values of $F(\phi,\Delta\phi)$ when the value of $\Delta\phi$ is set to 1 degree, 20 degrees, 40 degrees, 60 degrees, and 80 degrees. In FIG. 6, "A", "B", "C", "D", "E" show values of $F(\phi,\Delta\phi)$ for $\Delta\phi=1$ degree, $\Delta\phi=20$ degrees, $\Delta\phi=40$ degrees, $\Delta\phi=60$ degrees, and $\Delta\phi=80$ degrees, respectively. From FIG. 6, the larger the value of $\Delta\phi$, the smaller the maximum value of $F(\phi,\Delta\phi)$, and even when the value of $\Delta\phi$ is from 1 degree to 80 degrees, $F(\phi,\Delta\phi)$ takes the maximum value for $\phi=\phi_0$ (=−8.5 degrees) and x=−0.2 mm and the value of $\phi_0$ is independent of the value of $\Delta\phi$. Note that it is known that, from the curve of $F(\phi,\Delta\phi)$, it is desirable that $\Delta\phi$ takes a value from 1 degree to 60 degrees, preferably from 1 degree to 20 degrees.

Figure 8:
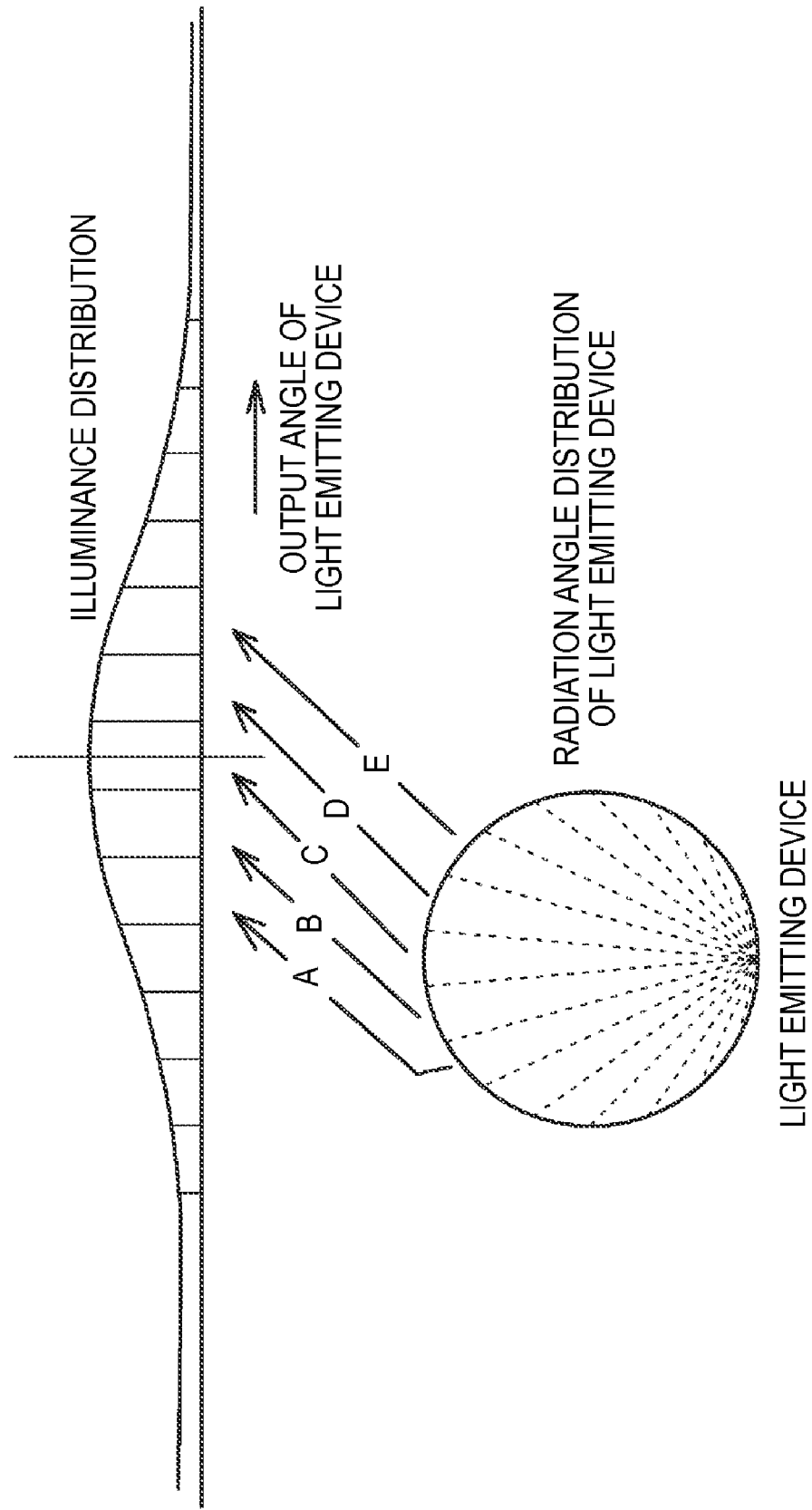
FIG. 8 is a conceptual diagram for explanation of setting a desired illuminance distribution with a variable of an output angle (radiation angle) of a light emitting device from a radiation angle distribution of the light emitting device.
Figure 9:
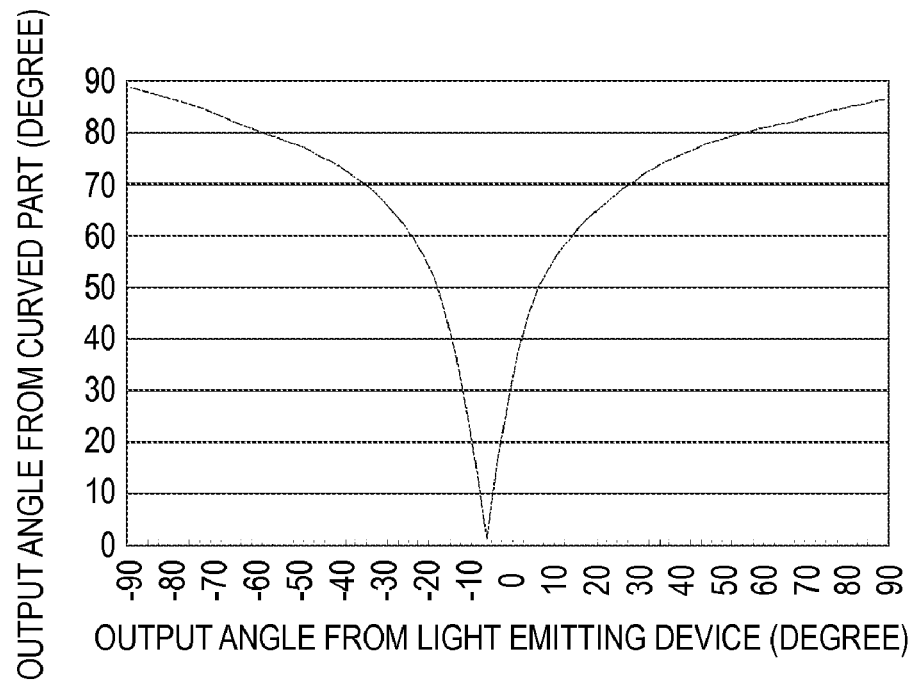
FIG. 9 is a graph showing a relationship between output angle (radiation angle) from the light emitting device and output angle from the curved part of the light output member.
Figure 10:
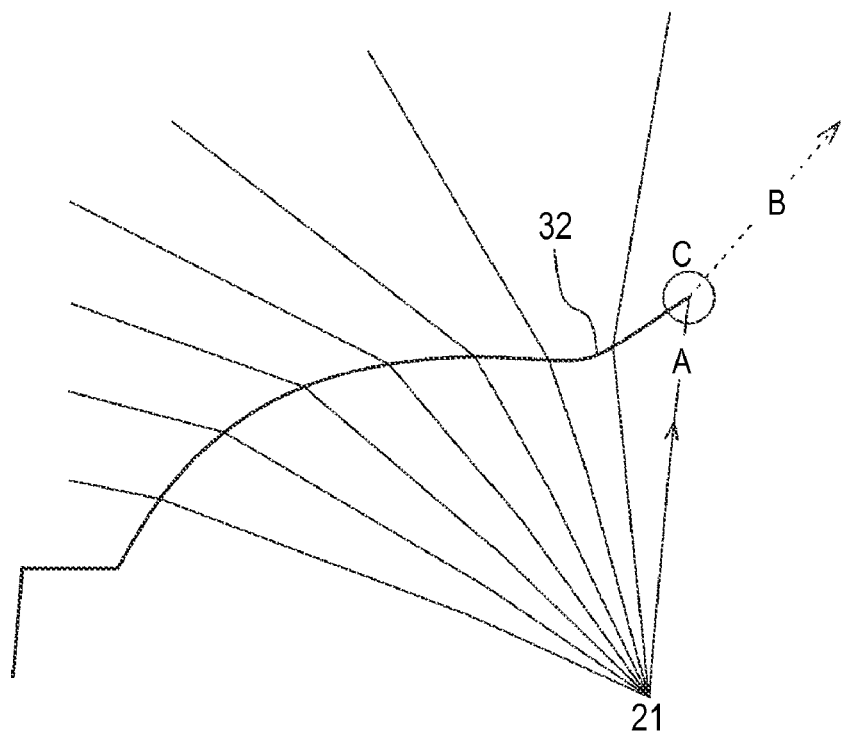
FIG. 10 is a conceptual diagram for explanation of obtaining a tilt angle of a micro region of a curved part when a beam output from the light emitting device at a certain output angle (radiation angle) collides with the micro region and is output based on the relationship between the output angle (radiation angle) from the light emitting device, incidental angle of the curved part, and the output angle from the curved part of the light output member.

The curves forming the curve part 32 may be determined in the following manner, for example. That is, the surface profile that outputs the light from the light emitting device 21 at an intended, target angle is calculated while output light intensity is corrected according to the transmittance in the curved part 32 of the light output member 30. For the purpose, first, a target illuminance distribution is set. For example, as shown in a conceptual diagram of FIG. 8, a desired illuminance distribution with a variable of an output angle (radiation angle) of the light emitting device is set from a radiation angle distribution of the light emitting device 21. In FIG. 8, states indicated by "A", "B", "C", "D", "E" show illuminance settings at the output angle (radiation angle) of −25 degrees to −15 degrees, −15 degrees to −5 degrees, −5 degrees to +5 degrees, 5 degrees to 15 degrees, 15 degrees to 25 degrees, respectively. Then, a relationship between the output angle (radiation angle) from the light emitting device 21 and the output angle from the curved part 32 of the light output member 30 (see FIG. 9), and further, an angle (called an incident angle to the curved part 32) of light when the light collides with the curved part 32 of the light output member 30 within the light output member 30 are obtained from calculation. Then, a tilt angle of a micro region (shown by a region surrounded by a circle of "C" in FIG. 10) when a beam output from the light emitting device 21 (shown by a solid line of "A" in FIG. 10) at a certain output angle (radiation angle) collides with the micro region C of the curved part 32 and is output in a desired direction (the output beam is shown by a dotted line of "B" in FIG. 10) based on the relationship between the output angle (radiation angle) from the light emitting device 21, the incident angle to the curved part 32, and the output angle from the curved part 32 of the light output member 30. By sequentially performing the operation, finally, the shape (function) of the curved part 32 can be obtained.

Figure 11A:
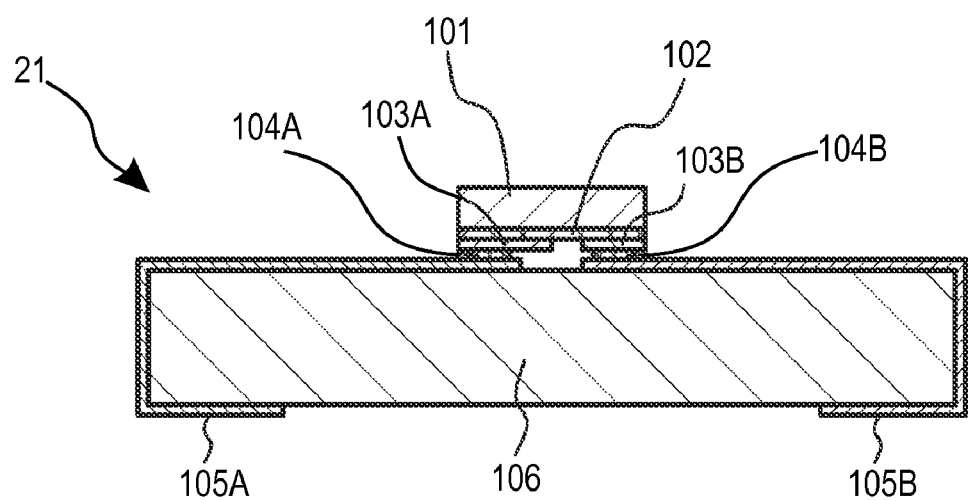
FIGS. 11A and 11B are schematic sectional views of the light emitting devices.

A gallium nitride series light emitting diode (LED) as the light emitting device 21 in working example 1 includes a base 101 and a light emitting layer 102 formed on the base 101 as shown by a schematic sectional view in FIG. 11A. The light emitting layer 102 has a laminated structure of a first compound semiconductor layer having a first conductivity type (e.g., n-type), an active layer formed on the first compound semiconductor layer, and a second compound semiconductor layer having a second conductivity type (e.g., p-type) formed on the active layer, though not shown in the drawing. The base 101 forming a red light emitting diode that emits red light (e.g., wavelength 640 nm) contains GaAs (reflective index $n_s$: 3.4), the base 101 forming a green light emitting diode and a blue light emitting diode that emit green light (e.g., wavelength 530 nm) and blue light (e.g., wavelength 450 nm) contains GaN (reflective index $n_s$: 2.438) or alumina (reflective index $n_s$: 1.78). Note that the composition, configuration, structure of the light emitting layer 102 forming each light emitting diode may be a known composition, configuration, structure. The light from the light emitting layer 102 passes through the base 101 and is output to the outside and enters the light output member 30 from the light incident lower surface 34 provided on the light output member 30. That is, the structure shown in FIG. 11A is a so-called flip-chip structure.

A first electrode 103A is electrically connected to the first compound semiconductor layer and the first electrode 103A is connected to a first wire 105A provided on a substrate 106 by a gold bump 104A. Further, a second electrode 103B is electrically connected to the second compound semiconductor layer and the second electrode 103B is connected to a second wire 105B provided on the substrate 106 by a gold bump 104B. The first wire 105A and the second wire 105B are connected to a light emitting device drive circuit (not shown) and the light emitting device 21 is driven by a pulse width modulation (PWM) signal from the light emitting device drive circuit or a CC signal from a constant current circuit. The substrate includes a metal core printed wiring board with wiring formed on both sides of an aluminum base, for example.

Figure 11B:
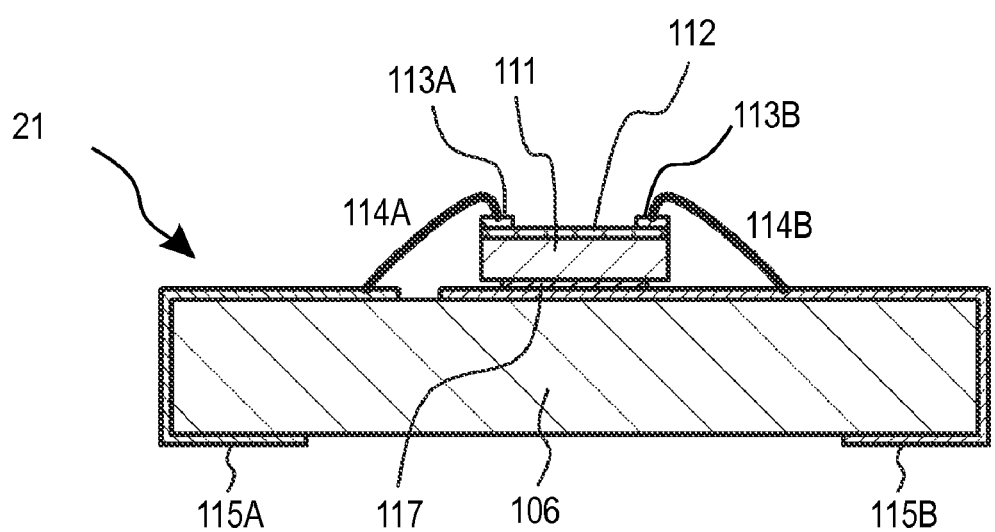

Alternatively, a gallium nitride series light emitting diode (LED) as the light emitting device 21 in working example 1 includes a base 111 and a light emitting layer 112 formed on the base 111 as shown by a schematic sectional view in FIG. 11B. The light emitting layer 112 has the same configuration, structure as that of the light emitting layer 102, and the base 111 has the same configuration, structure as that of the base 101. The light from the light emitting layer 112 enters the light output member 30 from the light incident lower surface 34 provided on the light output member 30. That is, the structure shown in FIG. 11B is a so-called face-up structure. The base 111 is fixed to a substrate 116 via a silver paste layer 117.

A first electrode 113A is electrically connected to the first compound semiconductor layer and the first electrode 113A is connected to a first wire 115A provided on the substrate 116 by a gold jumper line 114A. Further, a second electrode 113B is electrically connected to the second compound semiconductor layer and the second electrode 113B is connected to a second wire 115B provided on the substrate 116 by a gold jumper line 114B. The first wire 115A and the second wire 115B are connected to a light emitting device drive circuit (not shown) and the light emitting device 21 is driven by a pulse width modulation (PWM) signal from the light emitting device drive circuit or a CC signal from a constant current circuit.

The light output member 30 (e.g., made of a plastic material) may be molded not only by the transmolding method but according to an injection molding method. That is, a melted resin is injected into a die for injection molding, the resin is solidified, and then, the mold is opened and the light output member 30 is taken out from the die. The light output member 30 has a simple shape and is easily taken out from the die, and has high productivity and mass productivity. Further, in manufacturing, there is an extremely low possibility that the shape varies and it is difficult that defects (chipped portions) are caused. Note that, by forming a flange part (not shown) at the end of the side that does not contribute to light extraction, the member can more easily be taken out from the die and the light emitting device assembly is easily mounted to the surface light source device. Then, for example, the light emitting device 21 can be fixed to the light output member 30 by applying an adhesive of an epoxy resin that is transparent for light output from the light emitting device (e.g., the adhesive also functions as a light transmissive medium layer) to the recessed part 13 of the light output member 30 or the base 101, 111 of the light emitting device 21, positioning the light output member 30 on the base 101, 111, and curing the adhesive with the light output member 30 and the base 101, 111 in optically and closely contact with each other. Here, the size of the light emitting device 21 is sufficiently smaller than that of the substrate 106, 116, and thus, the distortion of the light output member 30 due to heat generated at operation of the light emitting device 21 can be reduced and the light extraction performance as desired can be obtained by fixing only the light emitting device 21 to the light output member 30, whereby a light extraction performance as has been designed can be obtained.

In working example 1, the value of the x coordinate of the curved part center axis is a positive value, and further, the function $F(\phi, \Delta\phi)$ monotonously increases and takes the maximum value at $\phi=\phi_0$ (<0), and then, monotonously decreases, as the value of $\phi$ increases from the minimum value. Therefore, it is ensured that light having the maximum light intensity is output from the curved part 32 in a desired direction (in the direction of the output angle $\theta_{I-max}$) within the XZ-plane, and further, many light beams are output in the horizontal direction as well. As a result, color irregularities are hard to occur and luminance irregularities are hard to occur.

WORKING EXAMPLE 2

Figure 13A:
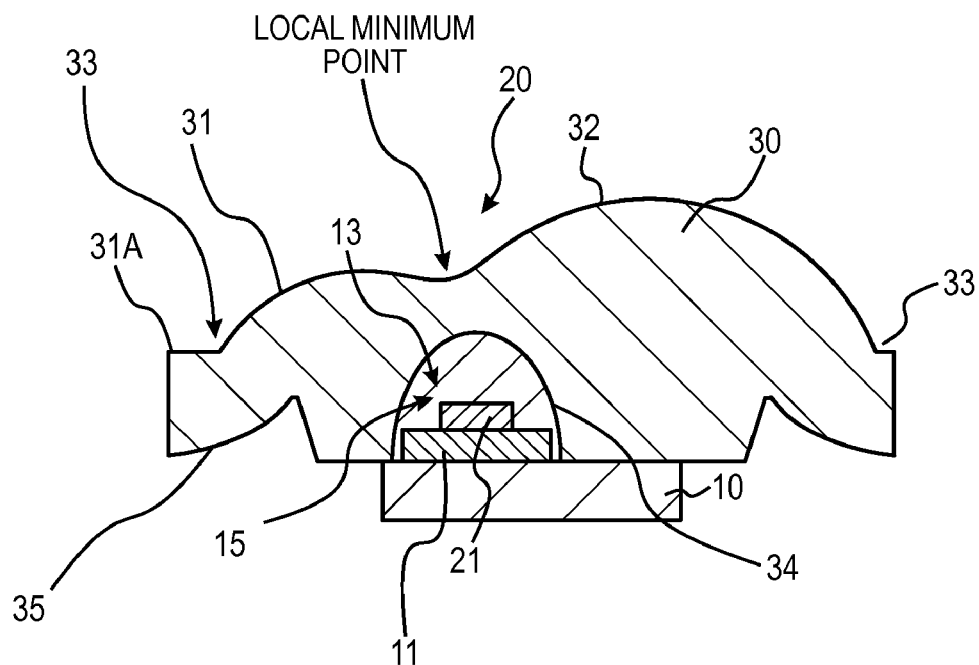
FIGS. 13A and 13B are schematic sectional views of a light output member and a light emitting device assembly of working example 2.
Figure 13B:
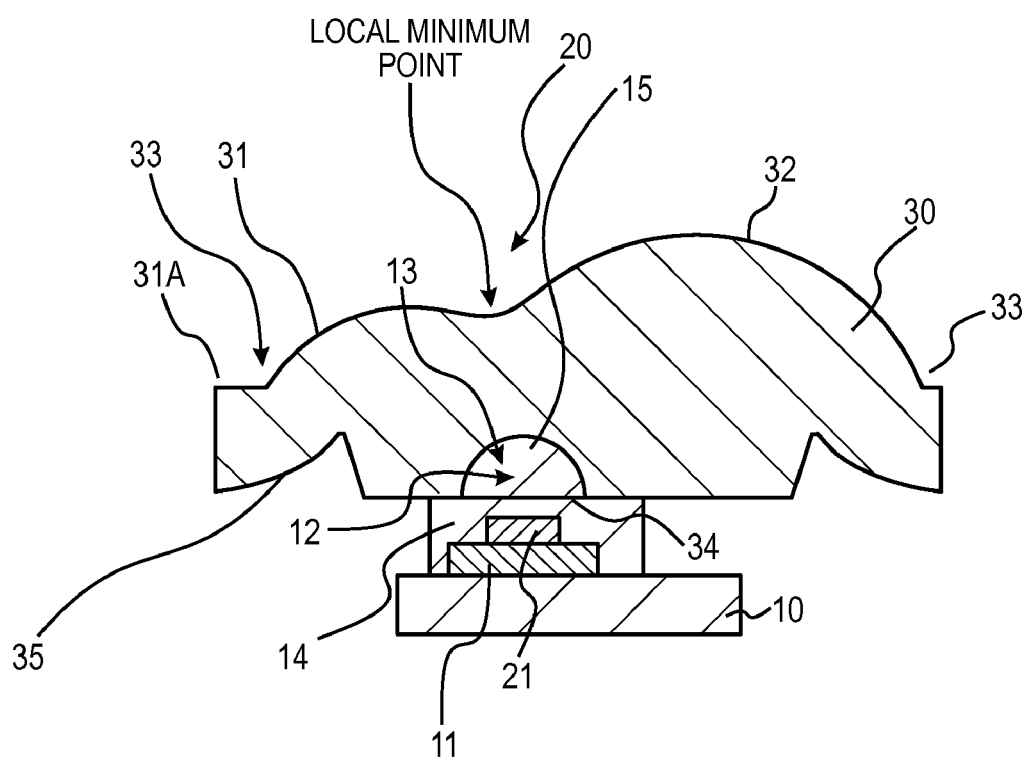

Working example 2 is a modification of working example 1. In working example 1, the light emitting device 21 is covered by the light output member 30 without gaps. On the other hand, in working example 2, as shown by schematic views of FIGS. 13A and 13B, the light emitting device 21 faces the light output member 30 via a light transmissive medium layer 15. Specifically, the recessed part 13 is filled with the light transmissive medium layer 15. Here, the light transmissive medium layer 15 includes a gelled silicone resin (refractive index: 1.41) and the light output member 30 includes a polycarbonate resin having a refractive index of 1.59. Except the above described points, the configuration, structure of the light output member 30, light emitting device assembly 20 of working example 2 may be the same as the configuration, structure of the light output member 30, light emitting device assembly 20 of working example 1, and the detailed description will be omitted.

WORKING EXAMPLE 3

Figure 15:
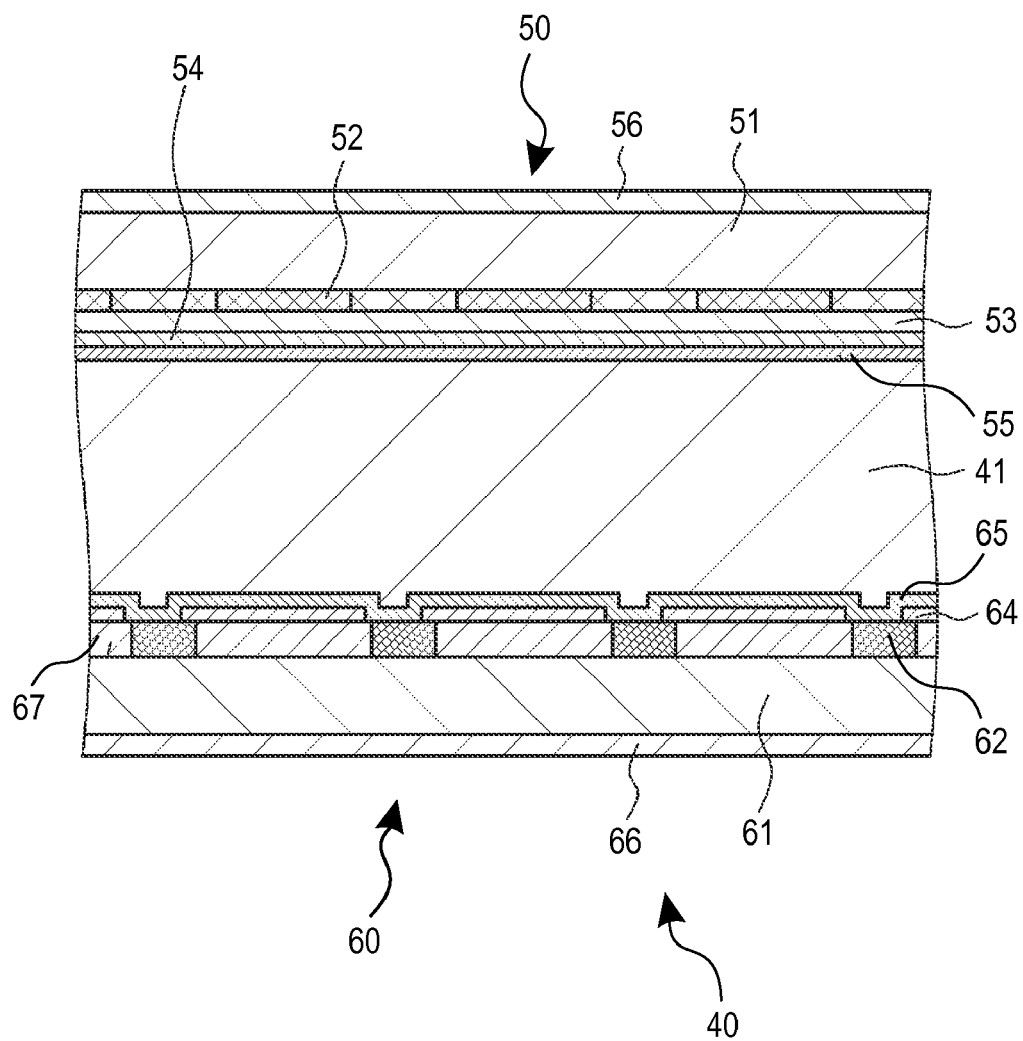
FIG. 15 is a schematically partial sectional view of the color liquid crystal display device assembly in working examples 3 to 5.
Figure 16A:
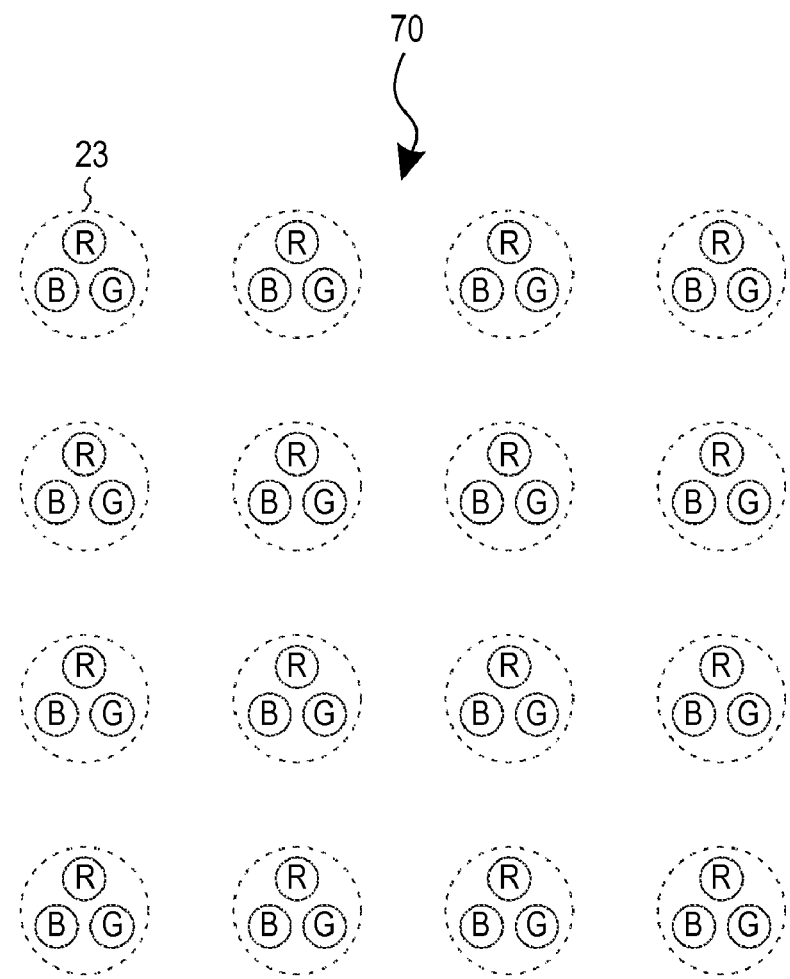
FIGS. 16A, 16B and 16C show arrangement conditions of light emitting device assembly units and light emitting device assemblies forming the surface light source device of working example 3.

Working example 3 relates to a surface light source device according to the first embodiment of the invention and a liquid crystal display device assembly according to the first embodiment of the invention. FIG. 14 is a schematically partial sectional view of a color liquid crystal display device assembly in the surface light source device of working example 3 or working examples 4 and 5 to be described later and FIG. 15 is a schematically partial sectional view of a color liquid crystal display device. Further, FIG. 16A shows an arrangement condition of light emitting device assembly units and light emitting device assemblies in the surface light source device of working example 3. FIG. 16A shows 4×4=16 of light emitting device assembly units 23.

A surface light source device 70 according to working example 3 or working examples 4 and 5 to be described later includes plural light emitting device assembly units 23, 24, 25, and each of the light emitting device assembly units 23, 24, 25 includes plural light emitting device assemblies 20. Further, a liquid crystal display device assembly according to working example 3 or working examples 4 and 5 to be described later includes:

(a) a liquid crystal display device (more specifically, a transmissive color liquid crystal display device) 40; and (b) the surface light source device 70 (more specifically, a direct-type surface light source device) that illuminates the liquid crystal display device 40 from the rear side. Each of the light emitting device assemblies 20 includes the above described light emitting device assembly 20 of the above described working example 1 or working example 2. In the drawings, the light emitting device assembly units 23, 24, 25 are enclosed by dotted lines.

The surface light source device 70 according to working example 3 or working examples 4 and 5 to be described later includes a casing 71 having an outer frame 73 and an inner frame 74 as shown in FIG. 14. The end of the transmissive color liquid crystal display device 40 is sandwiched and held by the outer frame 73 and the inner frame 74 with spacers 75A and 75B in between. Further, a guide member 76 is provided between the outer frame 73 and the inner frame 74 for preventing displacement of the color liquid crystal display device 40 sandwiched by the outer frame 73 and the inner frame 74. A light diffuser plate 81 is attached to the inner frame 74 in the upper part within the casing 71 via a spacer 75C and a bracket member 77. Further, a group of optical functional sheets such as a diffuser sheet 82, a prism sheet 83, and a polarization converter sheet 84 are stacked on the light diffuser plate 81.

A reflector sheet 85 is provided in the lower part within the casing 71. Here, the reflector sheet 85 is provided to be located lower than the lower end of the light output member 30 with its reflecting surface facing the light diffuser plate 81, and attached to a bottom surface 72A of the casing 71 via an attaching member (not shown). The reflector sheet 85 may include a silver-sensitized reflecting film having a structure with a silver reflecting film, a low-refractive-index film, and a high-refractive-index film sequentially stacked on a sheet base material, for example. The reflector sheet 85 reflects light output from the light output member 30 and the light reflected by a side surface 72B of the casing 71. Thus, red, green and blue output from the red light emitting device assembly 20R (shown by circled "R" in FIGS. 16A and 17A) that emits red light, output from the green light emitting device assembly 20G (shown by circled "G" in FIGS. 16A and 17A) that emits green light, and output from the blue light emitting device assembly 20B (shown by circled "B" in FIGS. 16A and 17A) that emits blue light are mixed and white light with high color purity can be obtained as illumination light. The illumination light passes through the light diffuser plate 81 and the group of optical functional sheets of the diffuser sheet 82, prism sheet 83, and polarization converter sheet 84, and illuminates the color liquid crystal display device 40 from the rear side.

The color liquid crystal display device 40 includes a front panel 50 having a transparent first electrode 54, a rear panel 60 having a transparent second electrode 64, and a liquid crystal material 41 provided between the front panel 50 and the rear panel 60 as shown in the schematically partial sectional view of FIG. 15.

The front panel 50 includes a first substrate 51 of a glass substrate and a polarizing film 56 provided on the outer surface of the first substrate 51, for example. A color filter 52 covered by an overcoating layer 53 of an acryl resin or epoxy resin is provided on the inner surface of the first substrate 51, the transparent first electrode (also referred to a common electrode, made of ITO, for example) 54 is formed on the overcoating layer 53, and an alignment film 55 is formed on the transparent first electrode 54. On the other hand, more specifically, the rear panel 60 includes a second substrate 61 of a glass substrate, switching elements (specifically, thin-film transistors, TFTs) 62 formed on the inner surface of the second substrate 61, transparent second electrodes (also referred to as pixel electrodes, made of ITO, for example) 64 controlled into or out of conduction by the switching elements 62, and a polarizing film 66 provided on the outer surface of the second substrate 61, for example. An alignment film 65 is formed on the entire surface containing the transparent second electrodes 64. The front panel 50 and the rear panel 60 are joined via a sealing material (not shown) on outer peripheries thereof. Note that the switching elements 62 are not limited to TFTs but may be MIM elements, for example. Further, the reference numeral 67 in the drawing denotes an insulating layer provided between the switching elements 62.

The various kinds of members and the liquid crystal material forming the transmissive color liquid crystal display device may be known members and materials, and the detailed description thereof will be omitted.

Figure 16B:
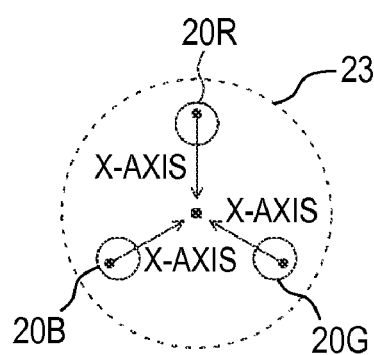
Figure 16C:
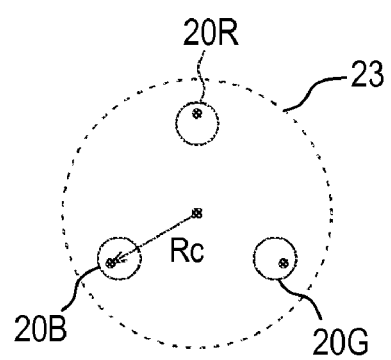

Further, in the surface light source device of working example 3 or the surface light source device forming the liquid crystal display device assembly, in each light emitting device assembly unit 23, X-axes toward the positive directions of the respective plural light emitting device assemblies 20 intersect at one point (see the arrangement condition of the red light emitting device assembly 20R, the green light emitting device assembly 20G and the blue light emitting device assembly 20B in the light emitting device assembly unit 23 in FIG. 16B). The Z-axes are shown by black points in FIGS. 16B and 16C, 17B and 17C, and FIGS. 19B and 19C.

The arrangement condition of the light emitting device assembly units 23 may be an arrangement in which the light emitting device assembly units 23 each including a set of the red light emitting device assembly 20R that emits red light, the green light emitting device assembly 20G that emits green light, and the blue light emitting device assembly 20B that emits blue light are arranged in the horizontal direction for forming a light emitting device assembly array and the light emitting device assembly arrays are arranged in the vertical directions.

In working example 3, the light emitting device assembly unit 23 includes three light emitting device assemblies 20 (one red light emitting device assembly 20R, one green light emitting device assembly 20G, and one blue light emitting device assembly 20B), and the respective Z-axes in the three light emitting device assemblies 20 are located on the apexes of equilateral triangles and on circles with radius $R_c$. That is, the distance between the Z-axes is $(3^{1/2} \cdot R_c)$ (see the arrangement condition of the red light emitting device assembly 20R, the green light emitting device assembly 20G and the blue light emitting device assembly 20B in the light emitting device assembly unit 23 in FIG. 16C).

Further, given that the distance from the light exit surface of the light emitting device 21 to the light diffuser plate 81 is H, $$0.1 \leq R_c/H \leq 0.6$$

is satisfied. Specifically,
$R_c = 5.66$ mm
$H = 20$ mm
$x_{max} = 2.86$ mm
$\theta_{I\text{-}max} = 75$ degrees.

According to the configuration, occurrence of luminance irregularities and color irregularities on the light diffuser plate 81 can be suppressed more reliably.

WORKING EXAMPLE 4

Figure 17A:
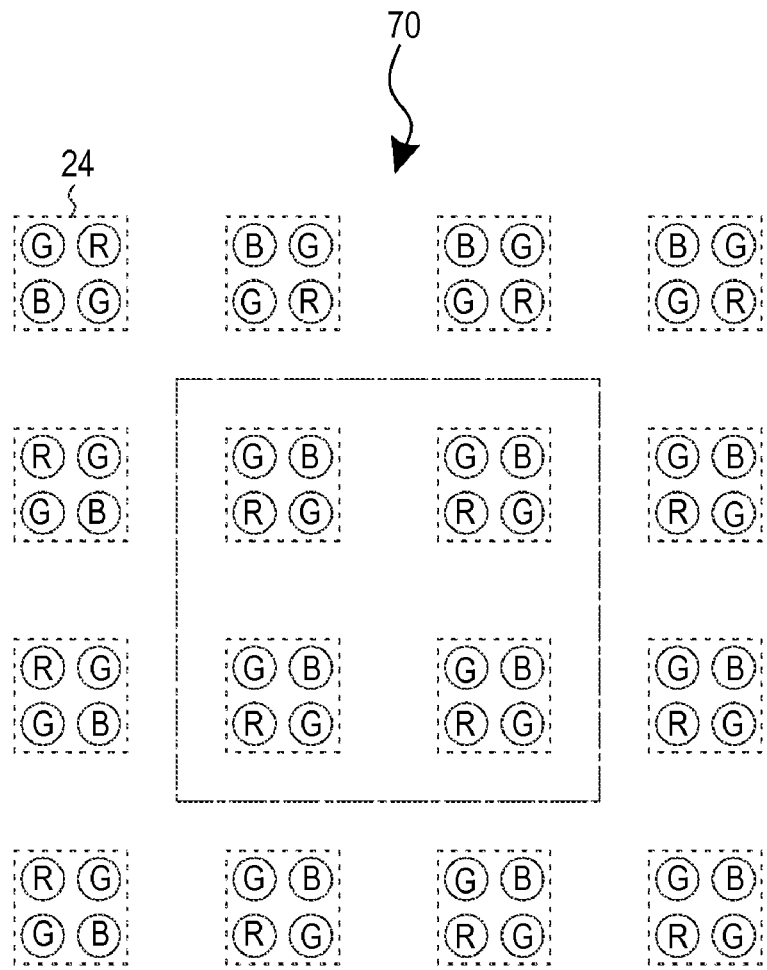
FIGS. 17A, 17B and 17C show arrangement conditions of light emitting device assembly units and light emitting device assemblies forming a surface light source device of working example 4.
Figure 17B:
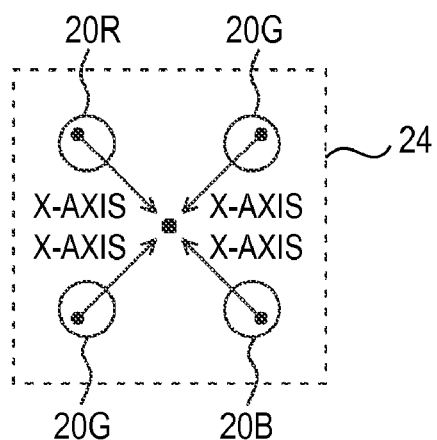
Figure 17C:
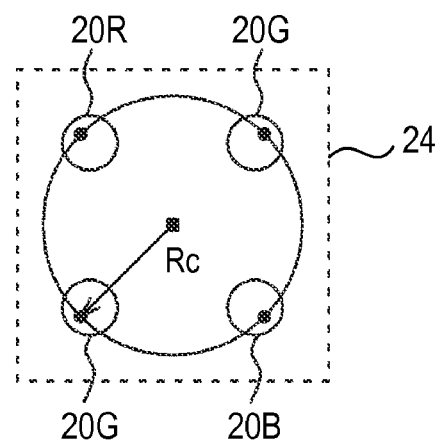

Working example 4 is a modification of working example 3. FIG. 17A shows an arrangement condition of light emitting device assembly units 24 and light emitting device assemblies in a surface light source device of working example 4. FIG. 17A shows 4×4=16 of the light emitting device assembly units 24.

In working example 3, the number of the respective light emitting device assemblies forming the light emitting device assembly unit 23 is (one red light emitting device assembly 20R, one green light emitting device assembly 20G, and one blue light emitting device assembly 20B). On the other hand, in working example 4, the light emitting device assembly unit 24 includes four light emitting device assemblies 20 (one red light emitting device assembly 20R, two green light emitting device assemblies 20G, and one blue light emitting device assembly 20B), and the respective Z-axes in the four light emitting device assemblies 20 are located on the apexes of squares and on circles with radius $R_c$. That is, the distance between the Z-axes is $(2^{1/2} \cdot R_c)$.

Further, given that the distance from the light exit surface of the light emitting device 21 to the light diffuser plate 81 is H, $$0.15 \leq R_c/H \leq 0.6$$

is satisfied. Specifically, $R_c$=5.66 mm
H=20 mm
$x_{max}$=2.86 mm
$\theta_{I-max}$=75 degrees.

According to the configuration, occurrence of luminance irregularities and color irregularities on the light diffuser plate 81 can be suppressed more reliably.

Figure 18A:
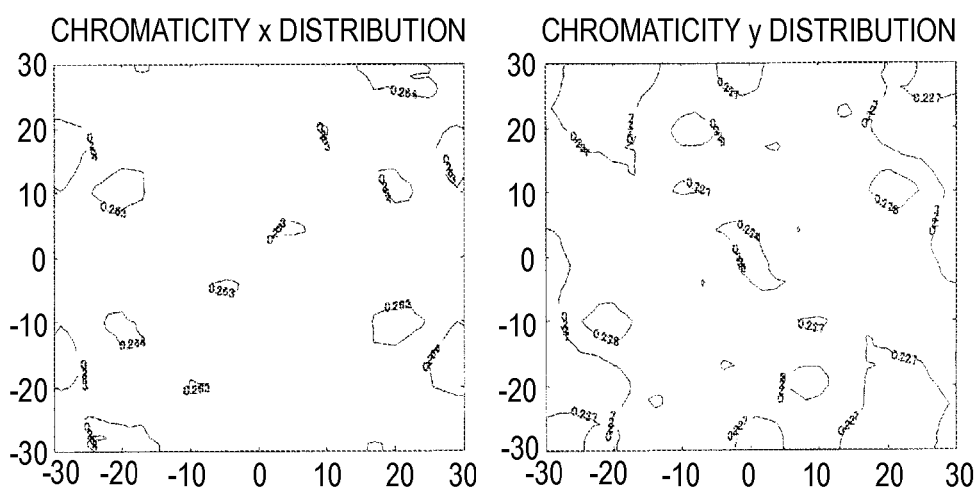
FIG. 18A shows an x value distribution and a y value distribution of chromaticity coordinates on a light diffuser plate in the surface light source device of working example 4.
Figure 18B:
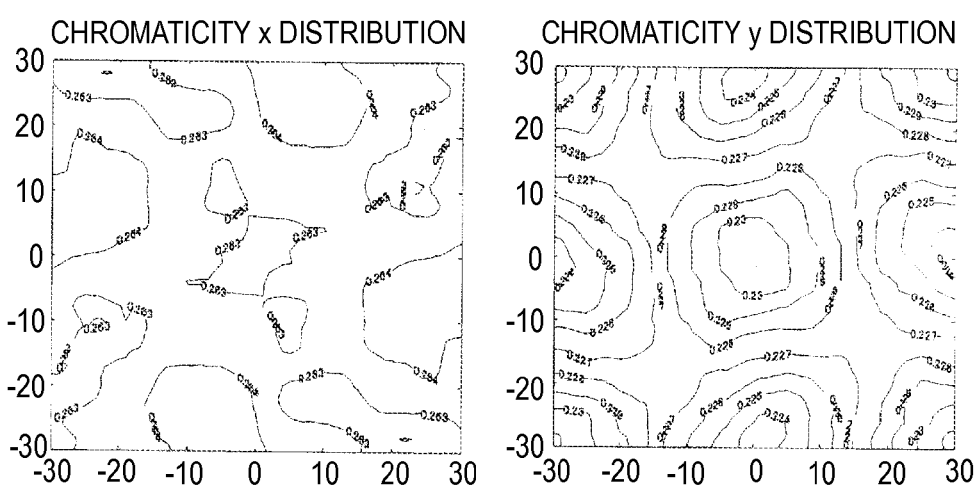
FIG. 18B shows an x value distribution and a y value distribution of chromaticity coordinates on the light diffuser plate in the surface light source device of comparative example 4.

FIG. 18A shows a simulation result of an x value distribution and a y value distribution of chromaticity coordinates on the light diffuser plate in the surface light source device of working example 4. Further, FIG. 18B shows a simulation result of an x value distribution and a y value distribution of chromaticity coordinates on the light diffuser plate in the surface light source device of comparative example 4. Here, in the surface light source device of comparative example 4, the configuration, structure of the light emitting device assembly is the same as the configuration, structure of the light output member and the light emitting device assembly of comparative example 1. Note that the arrangement condition of the light emitting device assemblies is the same as that of working example 4. Specifically, the distance between Z-axes within one light emitting device assembly is 8.0 mm, the distance between the centers of the light emitting device assembly units 24 adjacent to each other is 30 mm, and H=20 mm. Further, in FIGS. 18A and 18B, the x value distributions and y value distributions of chromaticity coordinates on the light diffuser plate in 60 mm×60 mm areas are shown, and the areas are shown by a dashed dotted line in FIG. 17A.

From FIGS. 18A and 18B, it is known that variations in chromaticity are drastically reduced in working example 4 compared to comparative example 4.

WORKING EXAMPLE 5

Figure 19A:
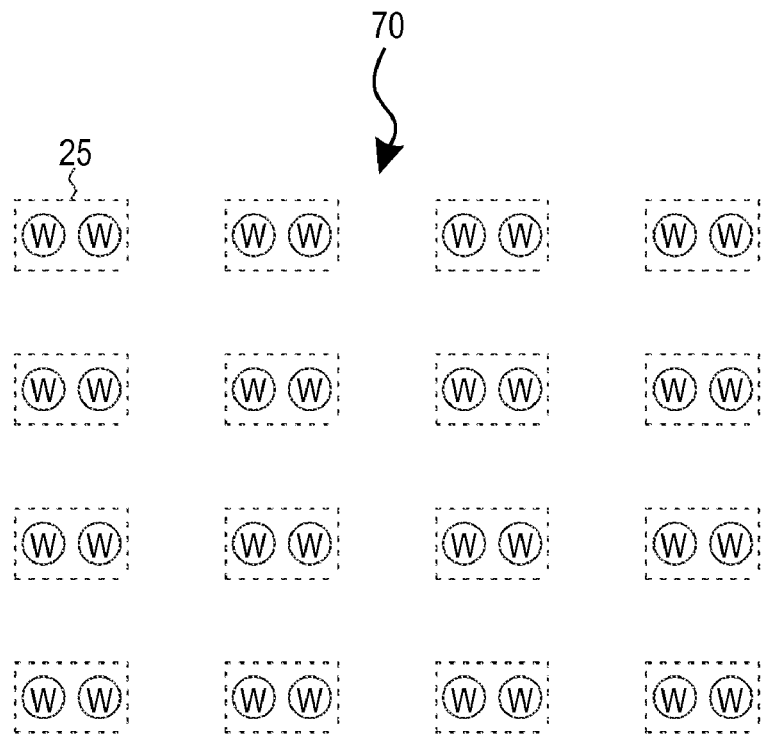
FIGS. 19A, 19B and 19C show arrangement conditions of light emitting device assembly units and light emitting device assemblies forming a surface light source device of working example 5.

Working example 5 relates to a surface light source device according to a second embodiment of the invention and a liquid crystal display device assembly according to the second embodiment of the invention. FIG. 19A shows an arrangement condition of light emitting device assembly units 25 and light emitting device assemblies in a surface light source device of working example 5. FIG. 19A shows 4×4=16 of the light emitting device assembly units 25. Note that the configuration, structure of the liquid crystal display device and the configuration, structure of the surface light source device of working example 5 are the same as the configuration, structure of the liquid crystal display device and the configuration, structure of the surface light source device of working example 3 except that the light emitting device assemblies forming the light emitting device assembly units and their arrangement are different from those of working example 3, and the detailed description will be omitted.

Figure 19B:
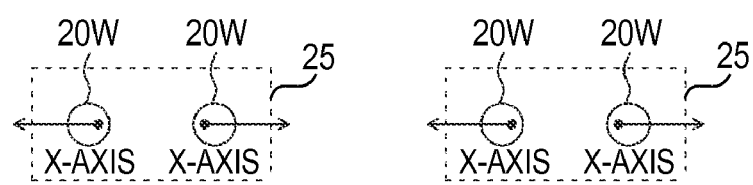
Figure 19C:
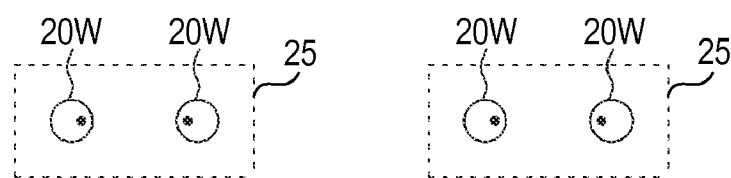

In the surface light source device or the surface light source device forming the liquid crystal display device assembly of working example 5, in each light emitting device assembly unit 25, X-axes of a pair of opposed light emitting device assemblies 20 overlap, and positive directions of the X-axes of the pair of opposed light emitting device assemblies 20 are opposite to each other (see the arrangement condition of light emitting device assemblies 20W in the light emitting device assembly unit 25 in FIG. 19B). In working example 5, the pair of light emitting device assemblies 20W (shown by circled "W" in FIG. 19A) include light emitting device assemblies that emit white light.

Further, given that the distance between the Z-axes in the pair of opposed light emitting device assemblies 20W within one light emitting device assembly unit 25 is $L_1$, the distance between the centers of the light emitting device assembly units 25 adjacent to each other in the X-axis direction is $L_2$, and the distance from the light exit surface of the light emitting device 21 to the light diffuser plate 81 is H, $$0.1 \leq (L_2/4 - L_1/2)/H \leq 0.6$$

is satisfied. Specifically, $L_1$=9.6 mm
$L_2$=38.4 mm
H=20 mm
$x_{max}$=2.86 mm
$\theta_{I-max}$=75 degrees.

According to the configuration, occurrence of luminance irregularities and color irregularities on the light diffuser plate 81 can be suppressed more reliably.

In working examples 3 to 5, a surface light source device of segmented drive system (partial drive system) described as below may be employed as the surface light source device.

The surface light source device of segmented drive system includes, assuming that the display area of the color liquid crystal display device is segmented into P×Q virtual display area units, P×Q surface light source units corresponding to these P×Q display area units, and the light emission statuses of the P×Q surface light source units are individually controlled.

As shown in a conceptual diagram of FIG. 20, the color liquid crystal display device 40 includes a display area 411 in which $M_0$ pixels in a first direction and $N_0$ pixels in a second direction, a total $M_0 \times N_0$ pixels are arranged in a two-dimensional matrix. Here, the display area 411 is assumed to be segmented into P×Q virtual display area units 412. Each display area unit 412 includes plural pixels. Specifically, for example, the resolution for image display satisfies the HDTV standards and (1920, 1080), for example, when the number of pixels $M_0 \times N_0$ arranged in the two-dimensional matrix are expressed by $(M_0, N_0)$. Further, in the display area 411 (shown by a dashed dotted line in FIG. 20) including the pixels arranged in the two-dimensional matrix is segmented into the P×Q virtual display area units 412 (their boundaries are shown by dotted lines). The values of (P,Q) are (19,12), for example. Note that, for simplification of the drawing, the numbers of the display area units 412 (and surface light source units 712, which will be described later) in FIG. 20 are different from the values. Each display area unit 412 includes plural (M×N) pixels and the number of pixels forming one display area unit 412 is about 10000, for example. Each pixel includes a set of plural subpixels that respectively emits light in different colors. More specifically, each pixel includes three kinds of subpixels of a first subpixel (blue light emitting subpixel, subpixel [B]), a second subpixel (green light emitting subpixel, subpixel [G]), and a third subpixel (red light emitting subpixel, subpixel [R]). The color liquid crystal display device 40 is line-sequentially driven. More specifically, the color liquid crystal display device 40 has scan electrodes (extending in the first direction) and data electrodes (extending in the second direction) intersecting in a matrix, and one screen is formed by inputting scan signals to the scan electrodes to select and scan the scan electrodes and displaying an image based on data signals (signals according to control signals) input to the data electrodes.

Specifically, the color liquid crystal display device 40 has a structure described in working examples 3 to 5.

The direct-type surface light source device (backlight) 70 includes P×Q surface light source units 712 corresponding to the P×Q virtual display area units 412, and each surface light source unit 712 illuminates the display area unit 412 corresponding to the surface light source unit 712 from the rear side. The light source of the surface light source unit 712 is individually controlled. Note that the light source luminance of the surface light source unit 712 is not affected by the light emission status of the light source of the other surface light source unit 712 or the like, for example. The surface light source device 70 is located under the color liquid crystal display device 40, however, the color liquid crystal display device 90 and the surface light source device 70 are separately shown in FIG. 20. The light source includes the light emitting device (light emitting diode) 21 to be driven according to the pulse width modulation (PWM) control system. The luminance of the surface light source unit 712 is increased and decreased by controlling the increase and decrease of the duty ratio in the pulse width modulation control of the light emitting device 21 forming the surface light source unit 712.

Figure 21:
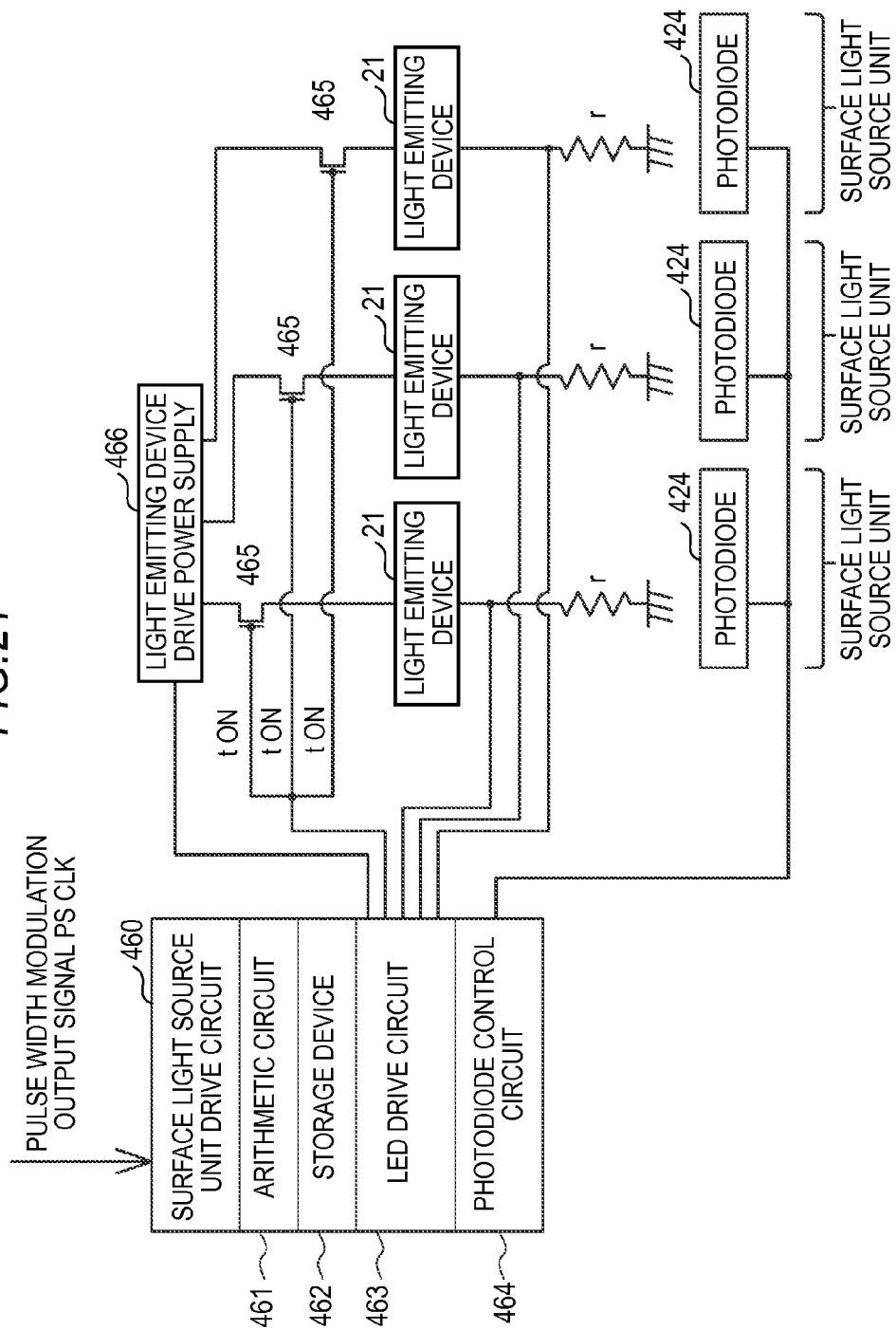
FIG. 21 is a conceptual diagram of a part of a drive circuit suitable for use in working examples.

As shown in FIGS. 20 and 21, drive circuits for driving the surface light source device 70 and the color liquid crystal display device 40 according to the drive signals from outside (display circuit) include a surface light source device control circuit 450 and surface light source unit drive circuits 460 that perform on/off control of the light emitting devices 21 forming the surface light source device 70 according to the pulse width modulation system, and a liquid crystal display device drive circuit 470.

The surface light source device control circuit 950 includes an arithmetic circuit 451 and a storage device (memory) 452. On the other hand, the surface light source unit drive circuit 460 includes an arithmetic circuit 461, a storage device (memory) 462, an LED drive circuit 463, a photodiode control circuit 464, a switching element 465 of an FET, and a light emitting device drive power supply (constant current source) 466. These circuits etc. forming the surface light source device control circuit 450 and the surface light source unit drive circuit 460 may be known circuits etc. On the other hand, the liquid crystal display device drive circuit 470 for driving the color liquid crystal display device 40 includes a known circuit such as a timing controller 471. The color liquid crystal display device 40 includes gate drivers, source drivers, etc. (not shown) for driving the switching elements of TFTs forming the liquid crystal cell.

Further, the light emission statuses of the light emitting devices 21 in a certain image display frame are measured by the photodiodes 424, the outputs from the photodiodes 424 are input to the photodiode control circuit 464 and used as data (signals) as luminance and chromaticity, for example, of the light emitting devices 21 in the photodiode control circuit 464 and the arithmetic circuit 461, and the data is sent to the LED drive circuit 463. Thus, a feedback mechanism of controlling the light emission statuses of the light emitting devices 21 in the next image display frame is formed.

A resistor r for current detection is inserted at the downstream of the light emitting device 21 in series with the light emitting device 21, and the operation of the light emitting device drive power supply 466 is controlled under the control of the LED drive circuit 463 so that current flowing in the resistor r may be converted into a voltage and a voltage drop in the resistor r may be a predetermined value. Here, one light emitting device drive power supply (constant current source) 466 is depicted in FIG. 21, however, in practice, the light emitting device drive power supplies 466 for respectively driving the light emitting devices 21 are provided. FIG. 21 shows three sets of surface light source units 712. FIG. 21 shows one surface light source unit 712 including one light emitting device 21, however, in practice, the number of light emitting devices 21 forming the light emitting device assembly unit in the surface light source unit 712 is three or four.

The display area 411 including the pixels arranged in the two-dimensional matrix and segmented into P×Q display area units may be expressed using "rows" and "columns" as segmented into P rows×Q columns display area units. Further, the display area unit 412 including plural (M×N) pixels may be expressed using "rows" and "columns" as including N rows×M columns pixels. Furthermore, the third subpixel (subpixel [R]), the second light emitting subpixel (subpixel [G]) and the first light emitting subpixel (subpixel [B]) may be collectively referred to as "subpixels [R,G,B]", a third subpixel control signal, a second subpixel control signal, and a first subpixel control signal to be input to the subpixels [R,G,B] for operation control of the subpixels [R,G,B] (specifically, control of light transmittance (aperture ratio, for example)) may be collectively referred to as "control signals [R,G,B]", a third subpixel drive signal, a second subpixel drive signal, and a first subpixel drive signal to be externally input to drive circuit for driving the subpixels [R,G,B] forming the display area unit may be collectively referred to as "drive signals [R,G,B]", As described above, each pixel includes one set of three kinds of subpixels of the third subpixel (subpixel [R]), the second subpixel (subpixel [G]), and the first subpixel (subpixel [B]). In the following description of working examples, the luminance control (gradation control) of each of the subpixels [R,G,B] is 8-bit control and performed at $2^8$ steps from 0 to 255. Accordingly, the respective values $sx_R$, $sx_G$, $sx_B$ of the drive signals [R,G,B] to be input to the liquid crystal display device drive circuit 470 for driving the respective subpixels [R,G,B] forming the respective pixels forming each display area unit 412 take $2^8$-step values. Further, values PS of the pulse width modulation output signals for controlling the respective light emitting times of the light emitting devices 21 forming each surface light source unit also take values of $2^8$ steps from 0 to 255. Note that the control is not limited to this, but, for example, 10-bit control at $2^{10}$ steps from 0 to 1023 can be performed. In this case, the representation with 8-bit numeric values may be increased four times, for example.

Control signals for controlling respective light transmittance Lt of the pixels are supplied from the drive circuit to the respective pixels. Specifically, control signals [R,G,B] for controlling the respective light transmittance Lt of the subpixels [R,G,B] are supplied from the liquid crystal display device drive circuit 470 to the respective subpixels [R,G,B]. That is, in the liquid crystal display device drive circuit 470, the control signals [R,G,B] are generated from the input drive signals [R,G,B] and the control signals [R,G,B] are supplied (output) to the subpixels [R,G,B]. For changing light source luminance $SY_2$ as luminance of the surface light source unit 712 with respect to each image display frame, the control signals [R,G,B] have values $SX_{R\text{-}corr}$, $SX_{G\text{-}corr}$, $SX_{B\text{-}corr}$, obtained by correcting (compensating) the values $sx_R$, $sx_G$, $sx_B$ of the drive signals [R,G,B] raised to the power of 2.2 according to the change of the light source luminance $SY_2$. Further, the control signals [R,G,B] are sent from the timing controller 471 forming the liquid crystal display device drive circuit 470 to the gate drivers and the source drivers of the color liquid crystal display device 40 according to a known method, the switching elements forming the respective subpixels are driven according to the control signals [R,G,B], desired voltages are applied to the transparent first electrode 54 and the transparent second electrodes 64 forming the liquid crystal cells, and thereby, the light transmittance (aperture ratio) Lt of the respective subpixels are controlled. Here, the larger the values $SX_{R\text{-}Corr}$, $SX_{G\text{-}corr}$, $SX_{B\text{-}corr}$ of the control signals [R,G,B], the higher the light transmittance Lt (aperture ratio) of the subpixels [R,G,B] and the higher the values of luminance (display luminance sy) of the parts of the display area corresponding to the subpixels [R,G,B]. That is, an image formed by light passing through the subpixels [R,G,B] (typically, a kind of dotted image) is bright.

The control of the display luminance sy and the light source luminance $SY_2$ is performed with respect to each image display frame, each display area unit, each surface light source unit in the image display of the color liquid crystal display device 40. Further, the operation of the color liquid crystal display device 40 and the operation of the surface light source device 70 within one image display frame are synchronized. The number of pieces of image information sent in one second (image per second) as electric signals to the drive circuit is a frame frequency (frame rate) and the inverse number of the frame frequency is a frame time (unit: second).

Figure 22:
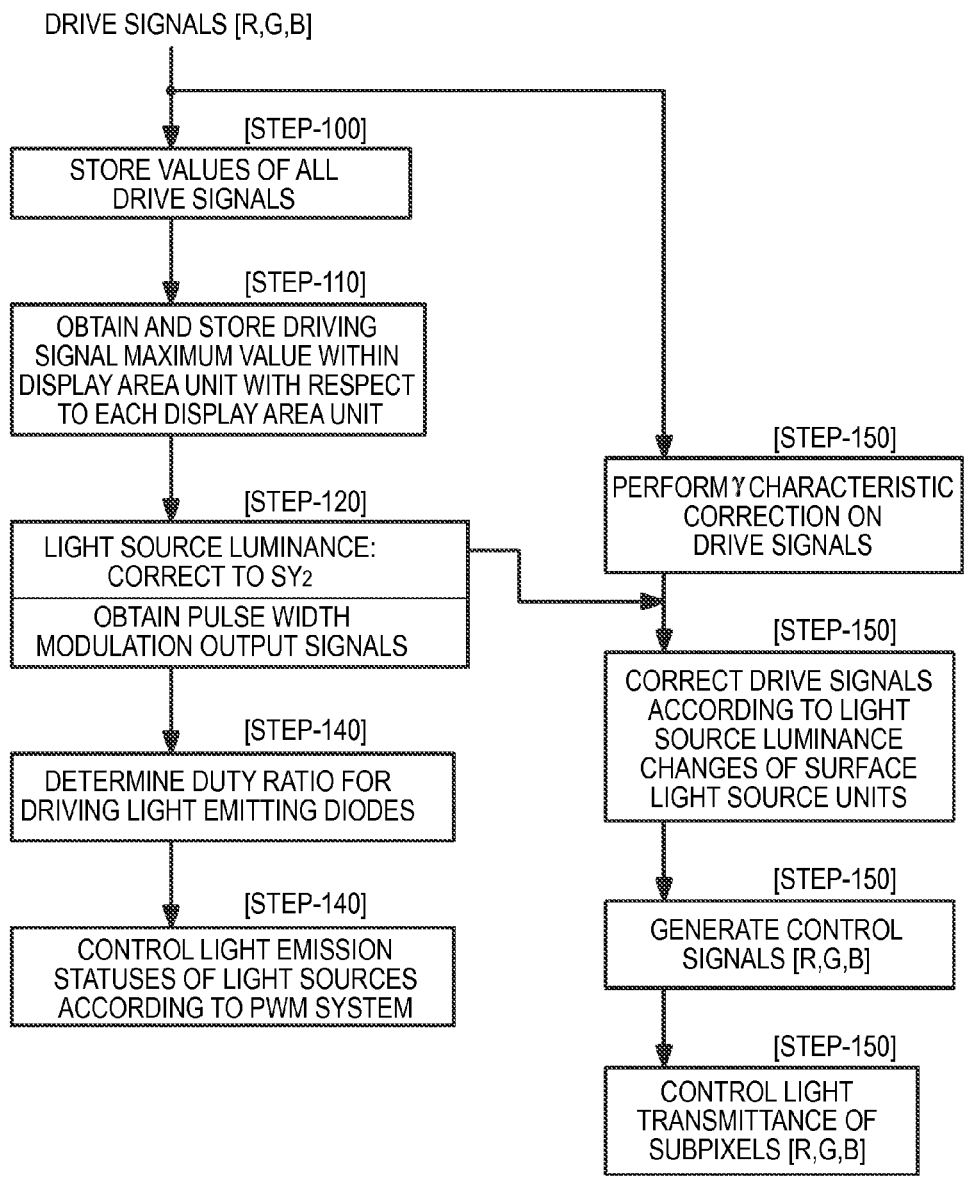
FIG. 22 is a flowchart for explanation of a driving method of the surface light source device of segmented drive system.

As below, a driving method of the surface light source device of segmented drive system will be explained with reference to FIGS. 20, 21 and 22. FIG. 22 is a flow chart for explanation of the driving method of the surface light source device of segmented drive system.

Here, the control signals for controlling respective light transmittance Lt of the pixels are supplied from the drive circuit to the respective pixels. More specifically, control signals [R,G,B] for controlling the respective light transmittance Lt of the respective subpixels [R,G,B] are supplied from the liquid crystal display device drive circuit 470 to the respective subpixels [R,G,B] forming the respective pixels. Further, in each of the surface light source units 712, the luminance of the light source forming the surface light source unit 712 corresponding to the display area unit 412 is controlled by the surface light source device control circuit 950 and the surface light source unit drive circuits 460 so that luminance of pixels (subpixels [R,G,B]) (display luminance second preset value $sy_2$ at the light transmittance first preset value $Lt_1$) assuming that control signals corresponding to drive signals having values equal to the drive signal maximum value $sx_{U\text{-}max}$ within display area unit as the maximum value of the values $sx_R$, $sx_G$, $sx_B$ of the drive signals [R,G,B] to be input to the drive circuits 450, 460, 470 for driving all pixels (subpixels [R,G,B]) forming the display area unit 912 are supplied to the pixels may be obtained. Specifically, the light source luminance $SY_2$ may be controlled (may be reduced, for example) so that the display luminance $sy_2$ may be obtained when the light transmittance (aperture ratio) is set to the light transmittance first preset value $Lt_1$. That is, for example, the light source luminance $SY_2$ of the surface light source unit 712 may be controlled to satisfy the following equation (A). Here, there is a relationship of $SY_2 \leq SY_1$.

$$SY_2 \cdot Lt_1 = SY_1 \cdot Lt_2 \quad (A)$$

(Step-100)

The drive signals [R,G,B] and clock signals CLK for one image display frame sent from a known display circuit such as a scan convertor are input to the surface light source device control circuit 450 and the liquid crystal display device drive circuit 470 (see FIG. 20). The drive signals [R,G,B] are output signals from an image pickup tube, output from a broadcasting station or the like, for example, and also drive signals input the liquid crystal display device drive circuit 470 for controlling the light transmittance Lt of the pixels. Given that an amount of input light to the image pickup tube is sy', for example, the drive signals are expressed by the input signal sy' raised to the power of 0.45. Further, the values $sx_R$, $sx_G$, $sx_B$ of the drive signals [R,G,B] for one image display frame input to the surface light source device control circuit 450 are temporarily stored in the storage device (memory) 452 forming the surface light source device control circuit 450.

Furthermore, also the values $sx_R$, $sx_G$, $sx_B$ of the drive signals [R,G,B] for one image display frame input to the liquid crystal display device drive circuit 470 are temporarily stored in the storage device (not shown) forming the liquid crystal display device drive circuit 470.

[Step-110]

Then, in the arithmetic circuit 451 forming the surface light source device control circuit 450, the values of the drive signals [R,G,B] stored in the storage device 452 are loaded and, in the (p,q)th display area unit 412 (note that, first, p=1, q=1), the drive signal maximum value $sx_{U\text{-}max}$ within display area unit as the maximum value of the values $sx_R$, $sx_G$, $sx_B$ of the drive signals [R,G,B] for driving subpixels in all pixels forming the (p,q)th display area unit 412 is obtained in the arithmetic circuit 451. Then, the drive signal maximum value $sx_{U\text{-}max}$ within display area unit is stored in the storage device 452. This step is executed with respect to all of m=1, 2, ..., M, n=1, 2, ..., N, i.e., M×N pixels.

For example, when $sx_R$ is a value corresponding to "110", $sx_G$ is a value corresponding to "150", and $sx_B$ is a value corresponding to "50", $sx_{U\text{-}max}$ is a value corresponding to "150".

The operation is repeated from (p,q)=(1,1) to (P,Q), and the drive signal maximum values $sx_{U\text{-}max}$ within all display area units are stored in the storage device 452.

[Step-120]

Figure 23A:
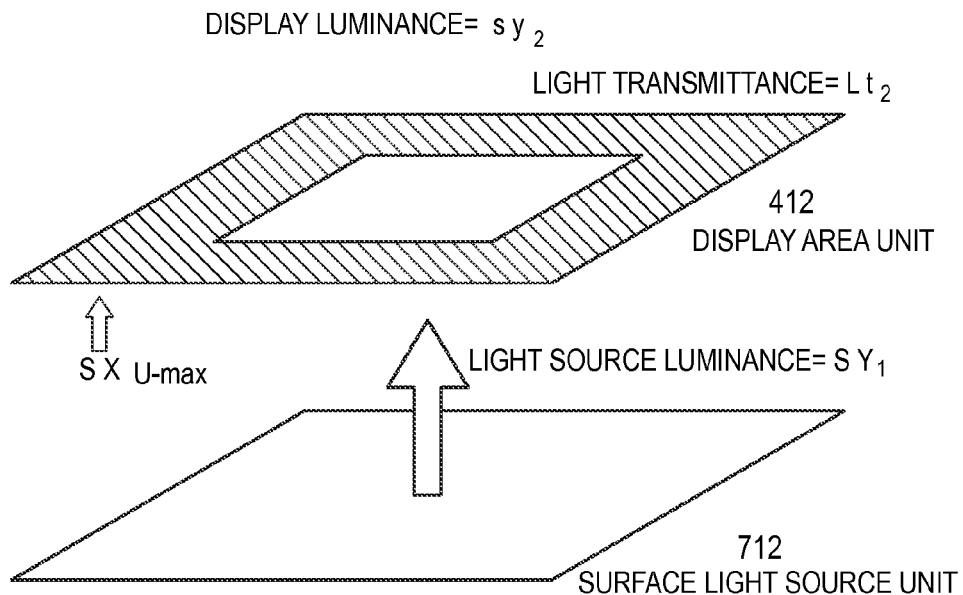
FIGS. 23A and 23B are conceptual diagrams for explanation of a condition in which light source luminance $SY_2$ of the surface light source unit is increased and decreased under the control of the surface light source unit drive circuit so that display luminance second preset value $sy_2$ assuming that control signals corresponding to drive signals having values equal to the drive signal maximum value $sx_{U\text{-}max}$ within display area unit are supplied to pixels may be obtained by the surface light source unit.
Figure 23B:
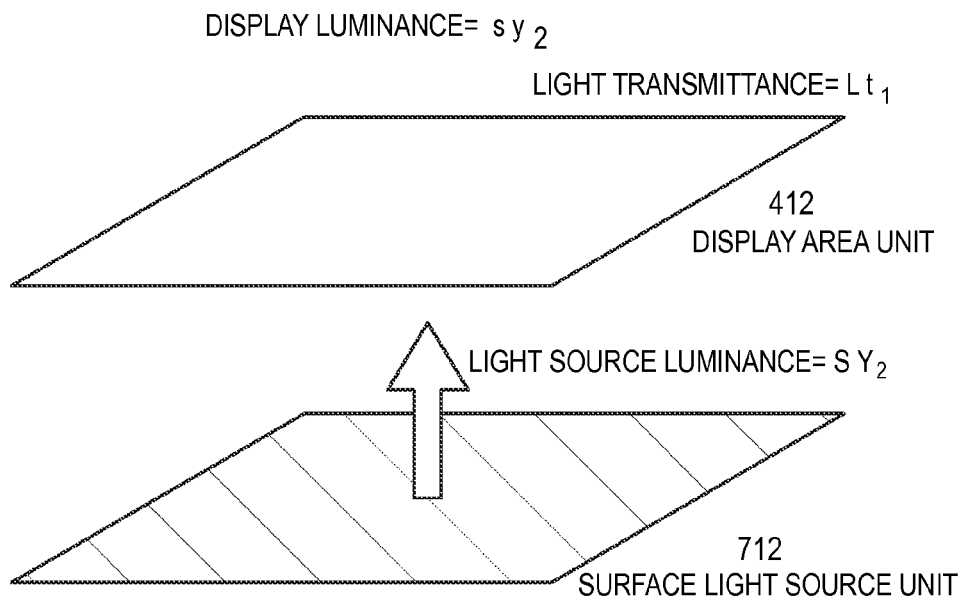

Then, the light source luminance $SY_2$ of the surface light source unit 712 corresponding to the display area unit 412 may be increased and decreased under the control of the surface light source unit drive circuit 460 so that the luminance (display luminance second preset value $sy_2$ at the light transmittance first preset value $Lt_1$) assuming that control signals [R,G,B] corresponding to the drive signals [R,G,B] having values equal to the drive signal maximum value $sx_{U\text{-}max}$ within display area unit are supplied to the subpixels [R,G,B] may be obtained by the surface light source unit 712. Specifically, the light source luminance $SY_2$ may be controlled with respect to each one image display frame and each one surface light source unit to satisfy the following equation (A). More specifically, the luminance of the light emitting devices 21 may be controlled according to the equation (B) as light source luminance control function $g(sx_{noI\text{-}max})$ as well as the light source luminance $SY_2$ may be controlled to satisfy the following equation (A). FIGS. 23A and 23B are conceptual diagrams of the control. Note that, as will be described later, it is desirable that correction according to the influence of the other surface light source unit 712 is performed on the light source luminance $SY_2$ according to need. These relationships regarding the control of the light source luminance $SY_2$, that is, the relationships and the like among the values of the drive signal maximum value $sx_{U\text{-}max}$ within display area unit, the values of the control signals corresponding to the drive signals having values equal to the drive signal maximum value $sx_{U\text{-}max}$ within display area unit, and the display luminance second preset value $sy_2$ assuming that the control signals are supplied to the subpixels, the light transmittance (aperture ratio) of respective subpixels [light transmittance second preset value $Lt_2$] in this case, and luminance control parameters in the surface light source unit 712 with which the display luminance second preset value $sy_2$ can be obtained given that the light transmittance (aperture ratio) of the respective subpixels is the light transmittance first preset value $Lt_1$ are obtained may be obtained in advance, and stored in the storage device 452 or the like.

$$SY_2 \cdot Lt_1 = SY_1 \cdot Lt_2 \tag{A}$$

$$g(sx_{noI\text{-}max}) = a_1 \cdot (sx_{noI\text{-}max})^{2.2} + a_0 \tag{B}$$

Here, given that the maximum value of the drive signals (drive signals [R,G,B]) input to the liquid crystal display device drive circuit 470 for driving the respective subpixels [R,G,B] is $sx_{max}$, $$sx_{noI\text{-}max} = sx_{U\text{-}max}/sx_{max}$$

where $a_1$ and $a_0$ are constant values and can be expressed by $$a_1 + a_0 = 1$$

$$0 < a_0 < 1, 0 < a_1 < 1.$$

For example, $a_1=0.99$ and $a_0=0.01$. Further, the respective values $sx_R$, $sx_G$, $sx_B$, of the drive signals [R,G,B] take $2^8$-step values, and the value of $sx_{max}$ is a value corresponding to "255".

In the surface light source device 70, for example, luminance control of the surface light source unit $712$ of $(p,q)=(1, 1)$ is assumed, it may be necessary that the influence of the other P×Q surface light source units 712 should be considered. The influence by the other surface light source units 712 on the surface light source unit 712 is determined in advance from the light emission profiles of the respective surface light source units 712, and thus, differences can be calculated by inverse operation and correction can be performed as a result. The basic form of the operation will be explained as below.

The luminance (light source luminance $SY_2$) required for the P×Q surface light source units 712 according to the requirements of equations (A) and (B) is expressed by a matrix $[L_{P \times Q}]$. Further, the luminance of a certain surface light source unit obtained when only the certain surface light source unit is driven and the other surface light source units are not driven is obtained in advance with respect to the P×Q surface light source units 712. The luminance is expressed by a matrix $[L'_{P \times Q}]$. Further, correction coefficients are expressed by a matrix $[\alpha_{P \times Q}]$. Then, the relationship between these matrices can be expressed by the following equation (C-1). The matrix $[\alpha_{P \times Q}]$ of the correction coefficients can be obtained in advance.

$$[L_{P \times Q}] = [L'_{P \times Q}] \cdot [\alpha_{P \times Q}] \tag{C-1}$$

Therefore, the matrix $[L'_{P \times Q}]$ may be obtained from the equation (C-1). The matrix $[L'_{P \times Q}]$ can be obtained by the operation of an inverse matrix. That is, $$[L'_{P \times Q}] = [L_{P \times Q}] \cdot [\alpha_{P \times Q}]^{-1} \tag{C-2}$$

may be calculated. Then, in order to obtain the luminance expressed by the matrix $[L'_{P \times Q}]$, the light sources (light emitting devices 21) provided in the respective surface light source units 712 may be controlled, specifically, the operation, processing may be performed using information (data tables) stored in the storage device (memory) 462. In the control of the light emitting devices 21, it is obvious that the operation results are necessary to fall within the positive region because the values of the matrix $[L'_{P \times Q}]$ are unable to take a negative values. Therefore, the solution of the equation (C-2) may not be an exact solution but be an approximate solution.

In this manner, the matrix $[L'_{P \times Q}]$ of the luminance assuming that the surface light source unit is singly driven is obtained according to the matrix $[L_{P \times Q}]$ and the correction coefficient matrix $[\alpha_{P \times Q}]$ obtained based on the values of the equations (A) and (B) obtained in the arithmetic circuit 451 forming the surface light source device control circuit 450 as described above, and further, the matrix is converted into corresponding integer numbers (values of pulse width modulation output signals) within a range from 0 to 255 according to the conversion table stored in the storage device 452. Thus, in the arithmetic circuit 451 forming the surface plight source device control circuit 450, values PS of the pulse width modulation output signals for controlling the light emission times of the light emitting devices 21 in the surface light source units 712 can be obtained.

[Step-130]

Then, the values PS of the pulse width modulation output signals obtained in the arithmetic circuit 451 forming the surface light source device control circuit 450 are sent to the storage devices 462 of the surface light source unit drive circuits 460 provided corresponding to the surface light source units 712 and stored in the storage devices 462. Further, also the clock signals CLK are sent to the surface light source unit drive circuits 460 (see FIG. 21).

[Step-140]

Then, the arithmetic circuit 461 determines ON times $t_{ON}$ and OFF times $t_{OFF}$ of the light emitting devices 21 forming the surface light source unit 712 based on the values PS of the pulse width modulation output signals. Here, $$t_{ON} + t_{OFF} = \text{constant value } t_{Const}$$

Further, the duty ratio in driving according to pulse width modulation of the light emitting devices can be expressed by $$t_{ON}/(t_{ON} + t_{OFF}) = t_{ON}/t_{Const}$$

Then, the signals corresponding to the ON times $t_{ON}$ of the light emitting devices 21 forming the surface light source unit 712 are sent to the LED drive circuit 463, and the switching elements 465 are turned on only in the ON times $t_{ON}$ according to the values of the signals corresponding to the ON times $t_{ON}$ from the LED drive circuit 463, and LED drive current from the light emitting device drive power supply 466 is flown to the light emitting devices 21. As a result, the respective light emitting devices 21 emit light only in the ON times $t_{ON}$ in one image display frame. Thus, the respective display area units 412 are illuminated with predetermined illuminance.

Figure 24A:
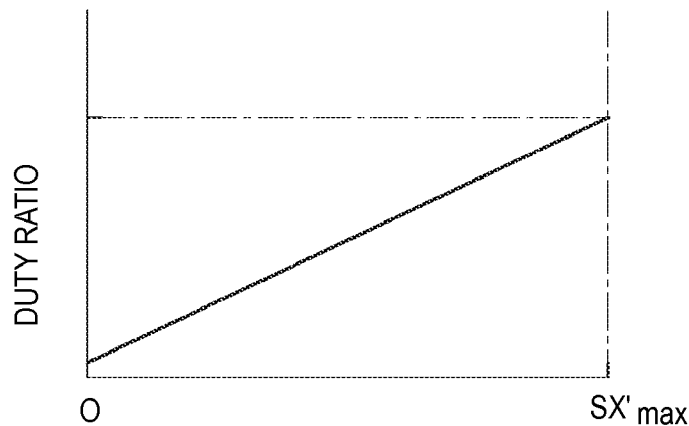
FIG. 24A schematically shows a relationship between value of the drive signal input to the liquid crystal display device drive circuit for driving the subpixel raised to the power of 2.2 ($sx' \equiv sx^{2.2}$) and duty ratio ($=t_{ON}/t_{Const}$).
Figure 24B:
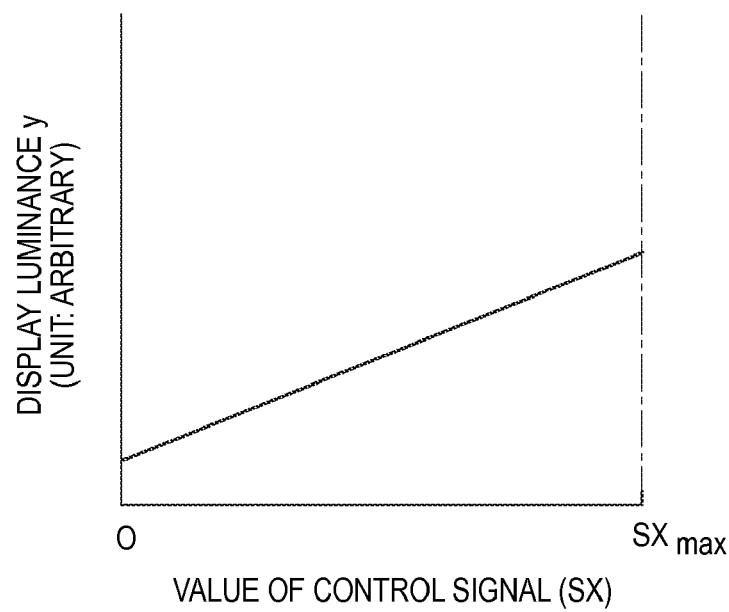
FIG. 24B schematically shows a relationship between value SX of the control signal for controlling the light transmittance of the subpixel and display luminance sy.

Thus obtained statuses are shown by solid lines in FIGS. 24A and 24B. FIG. 24A schematically shows a relationship between the value of the drive signal input to the liquid crystal display device drive circuit 470 for driving the subpixel raised to the power of 2.2 ($sx' \equiv sx^{2.2}$) and the duty ratio ($=t_{ON}/t_{Const}$), and FIG. 24B schematically shows a relationship between the value SX of the control signal for controlling the light transmittance of the subpixel and the display luminance sy.

[Step-150]

On the other hand, the values $sx_R$, $sx_G$, $sx_B$ of the drive signals [R,G,B] input to the liquid crystal display device drive circuit 470 are sent to the timing controller 471, and, in the timing controller 471, the control signals [R,G,B] corresponding to the input drive signals [R,G,B] are supplied (output) to the subpixels [R,G,B]. The values $SX_R$, $SX_G$, $SX_B$ of the control signals [R,G,B] generated in the timing controller 471 of the liquid crystal display device drive circuit 470 and supplied from the liquid crystal display device, drive circuit 470 to the subpixels [R,G,B] and the values $sx_R$, $sx_G$, $sx_B$ of the drive signals [R,G,B] have relationships of the following equations (D-1), (D-2), and (D-3). Here, the $b_{1\_R}$, $b_{0\_R}$, $b_{1\_G}$, $b_{1\_B}$, $b_{0\_B}$ are constant values. Further, since the light source luminance $SY_2$ of the surface light source unit 712 is changed with respect to each image display frame, the control signals [R,G,B] basically have values obtained by correcting (compensating) the values of the drive signals [R,G,B] raised to the power of 2.2 according to the change of the light source luminance $SY_2$. That is, since the light source luminance $SY_2$ changes with respect to each image display frame, the light transmittance (aperture ratio) $L_t$ of the pixels or subpixels is controlled by correcting (compensating) the values $SX_R$, $SX_G$, $SX_B$ of the control signals [R,G,B] so that the display luminance second preset value $sy_2$ may be obtained at the light source luminance $SY_2$. Here, the functions $f_R$, $F_G$, $f_B$ of the equations (D-1), (D-2), (D-3) are functions obtained in advance for the correction (compensation).

$$SX_R = f_R(b_{1\_R} \cdot sx_R^{2.2} + b_{0\_R}) \quad (D-1)$$

$$SX_G = f_G(b_{1\_G} \cdot sx_G^{2.2} + b_{0\_G}) \quad (D-2)$$

$$SX_B = f_B(b_{1\_B} \cdot sx_B^{2.2} + b_{0\_B}) \quad (D-3)$$

In this manner, the image display operation in one image display frame is completed.

Thus far, embodiments of the invention have been explained according to the preferred working examples, however, the invention is not limited to the working examples. The shapes, configurations, structures, component materials etc. of the light output member (light extraction lens) and light emitting device are examples and appropriate changes can be made, and the configurations, structures of the surface light source device and the liquid crystal display device assembly are also examples and appropriate changes can be made.

The present application contains subject matter related to that disclosed in Japanese Priority Patent Application JP 2008-191162 filed in the Japan Patent Office on Jul. 24, 2008, the entire contents of which is hereby incorporated by reference.

What is claimed is:

1. A light emitting device assembly comprising:
   (A) a light emitting device; and
   (B) a light output member provided on the light emitting element and having an upper surface on which a curved part that outputs light from the light emitting device is provided,
   wherein, assuming that (i) an axis line passing through the center of the curved part and being in parallel with a normal line of a light exit surface of the light emitting device is a curved part center axis,
   (ii) an orthogonal coordinate system (x, y, z) in a three-dimensional space has the normal line of the light exit surface of the light emitting device passing through the center of the light emitting device as the Z-axis, a plane containing the curved part center axis and the Z-axis as the XZ-plane, a point at which the Z-axis and the light exit surface of the light emitting device intersects as the origin,
   (iii) when light output from the curved part travels in a positive direction of the X-axis within the XZ-plane, an angle formed by the traveling direction of the light and the Z-axis takes a positive value,
   (iv) the light output from the origin at an angle φ formed with the Z-axis within the XZ-plane is output from the curved part at an angle θ formed with the Z-axis within the XZ-plane,
   (v) the light output from the origin at an angle (φ+|Δφ|/2) formed with the Z-axis within the XZ-plane is output from the curved part at an angle (θ+Δθ$_+$) formed with the Z-axis within the XZ-plane, and
   (vi) the light output from the origin at an angle (φ−|Δφ|/2) formed with the Z-axis within the XZ-plane is output from the curved part at an angle (θ+Δθ$_−$) formed with the Z-axis within the XZ-plane,
   the value of the x coordinate of the curved part center axis is a positive value,
   a locus of an edge of the curved part forms a circle or oval around the curved part center axis,
   the light on the Z-axis output from the origin is output from the curved part at an angle θ$_0$ (θ$_0$>0) formed with the Z-axis within the XZ-plane, and
   function F(φ,Δφ) expressed by $$F(\phi, \Delta\phi) = (\Delta\theta_+ - \Delta\theta_-)/\Delta\phi \quad (1)$$

monotonously increases, takes the maximum value at φ=φ$_0$ (<0), and then, monotonously decreases as the value of φ increases from the minimum value.

2. The light emitting device assembly according to claim 1, wherein the curved part has a concave surface and a convex surface continuous from the concave surface,
   an angle φ$_{min-v}$ formed by a local minimum point of the concave surface and the origin satisfies φ$_{min-v}$<φ$_0$,
   a curve obtained when the curved part is cut along an arbitrary virtual plane containing the normal line of the light exit surface of the light emitting device and passing through the local minimum point of the concave surface, from the local maximum point as the starting point, monotonously increases from a convex downward condition via a point of inflexion into a convex upward condition, passes through the local maximum point, and monotonously decreases in a convex upward condition.

3. The light emitting device assembly according to claim 1, wherein the Δφ takes one value equal to or less than 60 degrees.

4. The light emitting device assembly according to claim 1, wherein a value $X_{I-max}$ of x coordinate at a point where light having the maximum light intensity is output from the curved part within the XZ-plane is a positive value.

5. The light emitting device assembly according to claim 1, wherein a curve obtained when the curved part is cut along the XZ-plane includes a first curve having a first local maximum value in a convex upward condition, a second curve smoothly connected to the first curve and having a local minimum value in a convex downward condition, and a third curve smoothly connected to the second curve and having a second local maximum value in a convex upward condition, as the value of the x coordinate increases from the minimum value.

6. The light emitting device assembly according to claim 5, wherein the second maximum value is larger than the first maximum value.

7. The light emitting device assembly according to claim 1, wherein the curved part has a non-rotationally symmetric shape with respect to the Z-axis.

8. The light emitting device assembly according to claim 1, wherein the curved part is symmetric with respect to the XZ-plane.

9. The light emitting device assembly according to claim 1, wherein the light emitting device faces the light output member via a light transmissive medium layer.

10. The light emitting device assembly according to claim 1, wherein there is an air layer between the light output member and the light emitting device,
   a light incident lower surface facing the curved part is provided on the light output member, and
   light from the light emitting device enters from the light incident lower surface into the light output member via the air layer.

11. The light emitting device assembly according to claim 1, wherein the light output member has a light reflecting lower surface that internally reflects and outputs the light internally reflected on the curved part from the upper surface.

12. The light emitting device assembly according to claim 11, wherein the light reflecting lower surface is located at an edge part of the light output member and includes a tilted surface, and
   the tilted surface is tilted downward toward the outside and convex downward.

13. A light output member provided on the light emitting element and having an upper surface on which a curved part that outputs light from the light emitting device- is provided,
   wherein, assuming that (i) an axis line passing through the center of the curved part and being in parallel with a normal line of a light exit surface of the light emitting device is a curved part center axis,
   (ii) an orthogonal coordinate system (x, y, z) in a three-dimensional space has the normal line of the light exit surface of the light emitting device passing through the center of the light emitting device as the Z-axis, a plane containing the curved part center axis and the Z-axis as the XZ-plane, a point at which the Z-axis and the light exit surface of the light emitting device intersects as the origin,
   (iii) when light output from the curved part travels in a positive direction of the X-axis within the XZ-plane, an angle formed by the traveling direction of the light and the Z-axis takes a positive value,
   (iv) the light output from the origin at an angle $\phi$ formed with the Z-axis within the XZ-plane is output from the curved part at an angle $\theta$ formed with the Z-axis within the XZ-plane,
   (v) the light output from the origin at an angle $(\phi+|\Delta\phi|/2)$ formed with the Z-axis within the XZ-plane is output from the curved part at an angle $(\theta+\Delta\theta_+)$ formed with the Z-axis within the XZ-plane, and
   (vi) the light output from the origin at an angle $(\phi-|\Delta\phi|/2)$ formed with the Z-axis within the XZ-plane is output from the curved part at an angle $(\theta+\Delta\theta_-)$ formed with the Z-axis within the XZ-plane,
the value of the x coordinate of the curved part center axis is a positive value,
a locus of an edge of the curved part forms a circle or oval around the curved part center axis,
the light on the Z-axis output from the origin is output from the curved part at an angle $\theta_0(\theta_0>0)$ formed with the Z-axis within the XZ-plane, and
function $F((\phi,\Delta\phi)$ expressed by $$F(\phi,\Delta\phi)=(\Delta\theta_+-\Delta\theta_-)/\Delta\phi \qquad (1)$$

monotonously increases, takes the maximum value at $\phi=\phi_0$ (<0), and then, monotonously decreases as the value of $\phi$ increases from the minimum value.

* * * * *